United States Patent [19]

Yamaguchi et al.

[11] Patent Number: 4,947,373
[45] Date of Patent: Aug. 7, 1990

[54] DYNAMIC RAM

[75] Inventors: Yasunori Yamaguchi, Tokyo; Katsuyuki Sato, Kodaira; Jun Mitake, Musashino; Hitoshi Kawaguchi, Yokohama; Masahiro Yoshida, Tachikawa; Terutaka Okada, Ohme; Makoto Morino, Akishima; Tetsuya Saeki; Yosuke Yukawa, both of Ohme; Osamu Nagashima, Kodaira, all of Japan

[73] Assignees: Hitachi Ltd.; Hitachi VLSI Engineering Corp., both of Tokyo, Japan

[21] Appl. No.: 134,355

[22] Filed: Dec. 17, 1987

[30] Foreign Application Priority Data

Dec. 17, 1986 [JP] Japan .................. 61-298710
Mar. 27, 1987 [JP] Japan .................. 62-71508

[51] Int. Cl.⁵ ............................................. G11C 13/00
[52] U.S. Cl. ............................ 365/189.04; 365/207; 365/221
[58] Field of Search ........... 365/189.04, 207, 221, 365/189.05, 230.03, 230.04, 239, 240

[56] References Cited

U.S. PATENT DOCUMENTS

| | | | |
|---|---|---|---|
| 4,322,635 | 3/1982 | Redwine | 365/240 |
| 4,367,540 | 1/1983 | Shimohigashi | 365/207 |
| 4,429,375 | 1/1984 | Kobayashi et al. | 365/240 |
| 4,586,166 | 4/1986 | Shaw | 365/207 |
| 4,667,313 | 5/1987 | Pinkham et al. | 365/240 |

*Primary Examiner*—Terrell W. Fears
*Attorney, Agent, or Firm*—Antonelli, Terry, Stout & Kraus

[57] ABSTRACT

A semiconductor memory is provided with a first memory cell group, a second memory cell group, a first register for a serial output operation for holding information related to the first memory cell group, a second register for a serial output operation for holding information related to the second memory cell group, and transfer means for transferring information related to either the first or second memory cell group to either the first or second serial output register. By virtue of this arrangement, while the information transferred to the first serial output register is being serially output therefrom, information can simultaneously be transferred to the second serial output register by the transfer means.

11 Claims, 9 Drawing Sheets

DYNAMIC RAM

BACKGROUND OF THE INVENTION

The present invention relates to a semiconductor memory and, more particularly, to a technique which may effectively be utilized for, for example, a dual-port memory or the like which has both a random access port and a serial access port.

As a picture frame buffer memory used for displaying characters or figures on the screen of a CRT (cathode-ray tube), for example, a dual-port memory is employed.

A conventional dual-port memory, is, as exemplarily shown in FIG. 4, provided with a data register DR1 in which bits are respectively provided in correspondence with complementary data lines in a memory array M-ARY, and a data selector DSL1 which selectively connects the bits in the data register DR1 to a serial input/output complementary common data line CDS1. The data selector DSL1 is composed of switching MOSFETs which are respectively supplied with corresponding data register select signals from a pointer PNT. These data register select signals are sequentially formed in such a manner that a shift signal of the logic "1" which is set in the pointer PNT is shifted in accordance with a timing signal $\phi c$ which is formed on the basis of a serial clock signal SC (not shown).

As shown in FIG. 5, a serial output operation for storage data in the dual-port memory is started by designating the row address r of a word line in M-ARY1 from which data is to be read out by address signals A0 to Ai, changing a data transfer control signal $\overline{DT/OE}$ to a low level, and then changing a row address strobe signal $\overline{RAS}$ to a low level. Slightly after the fall of the row address strobe signal $\overline{RAS}$, a top column address c from which a serial output operation is to be started is designated in the form of address signals A0 to Ai, and then a column address strobe signal $\overline{CAS}$ is changed to a low level. Thus, in the dual-port memory, bits of data stored in memory cells of M-ARY1 which are coupled to the designated word line are read out for each of the rows and are transferred to the data register DR1 in response to the change of the data transfer control signal $\overline{DT/OE}$ from the low level to the high level. These bits of data thus read out are serially output through the serial input/output complementary common data line $\overline{CDS1}$ in such a manner that the storage data corresponding to the column address c is in the forefront.

Such a dual-port member is described, for example, in the May 20, 1985, issue of "Nikkei Electronics", p. 209 to 211, and the Mar. 24, 1986, issue of "Nikkei Electonics", p. 254, Nikkei McGraw-Hill which are hereby incorporated by reference. For purposes of drawing simplification, FIG. 4 does not show details of the memory circuit construction since these are well-known, as discussed in the above-noted articles.

It has been clarified by the present inventors that the above-described dual-port memory suffers from the following problems. The storage data serial output operation in the serial output mode of the dual-port memory is started in response to the return of the data transfer control signal $\overline{DT/OE}$ to the high level as described above. Accordingly, to continuously execute such serial output operation, it is necessary to start a readout data transfer cycle for a subsequent serial output mode immediately before the storage data output operation in the previous serial output mode reaches the final column address n, and change the data transfer control signal $\overline{DT/OE}$ from the low level to the high level after the storage data output operation in the previous serial output mode has reached the final column address n as shown in FIG. 5. Moreover, the timing at which the data transfer control signal $\overline{DT/OE}$ is changed to the high level must be so set that a setup time Tts and a hold time Tth for the serial clock signal SC can be ensured, respectively, before and after of said timing. For this reason, it is essential to provide outside the dual-port memory a counter circuit for counting column addresses in accordance with the serial clock signal SC and a timing generator circuit for forming the data transfer control signal $\overline{DT/OE}$ and the like in accordance with relatively strict timing conditions such as those described above. This leads to a undesirable increase in the system cost. In addition, as the data transfer rate in video systems or the like is increased, it may become impossible to form the data transfer control signal $\overline{DT/OE}$ in accordance with the above-described strict timing conditions.

SUMMARY OF THE INVENTION

It is an object of the present invention to provide a semiconductor memory which is so designed that serial input/output operations are conducted at higher speed.

It is another object of the present invention to facilitate the timing control to thereby simplify the arrangement of a controller which is provided outside the semiconductor memory and lower the production cost thereof.

The above and other objects and novel features of the present invention will become clear from the following description of the preferred embodiments thereof taken in conjunction with the accompanying drawings.

A typical one of the embodiments disclosed in this application will briefly be described below.

Namely, a dual-port memory is provided with two sets of data registers, and while a storage data serial input/output operation is being conducted through one of the data registers, parallel transfer of storage data is executed between the other data register and a plurality of memory cells coupled to a selected word line.

By virtue of the above-described means, while a serial input/output operation for storage data is being carried out through one data register, parallel transfer of storage data can be performed through the other data register at a relatively arbitrary timing. Therefore, it is possible to repeat a serial input/output operation ceaselessly at a relatively high data transfer rate. In addition, it is possible to simplify the arrangement of a processing unit or the like which is provided outside the dual-port memory. Thus, it is possible to realize a system which has an excellent cost/performance ratio.

DESCRIPTION OF THE PREFERRED EMBODIMENTS

Figure 2:
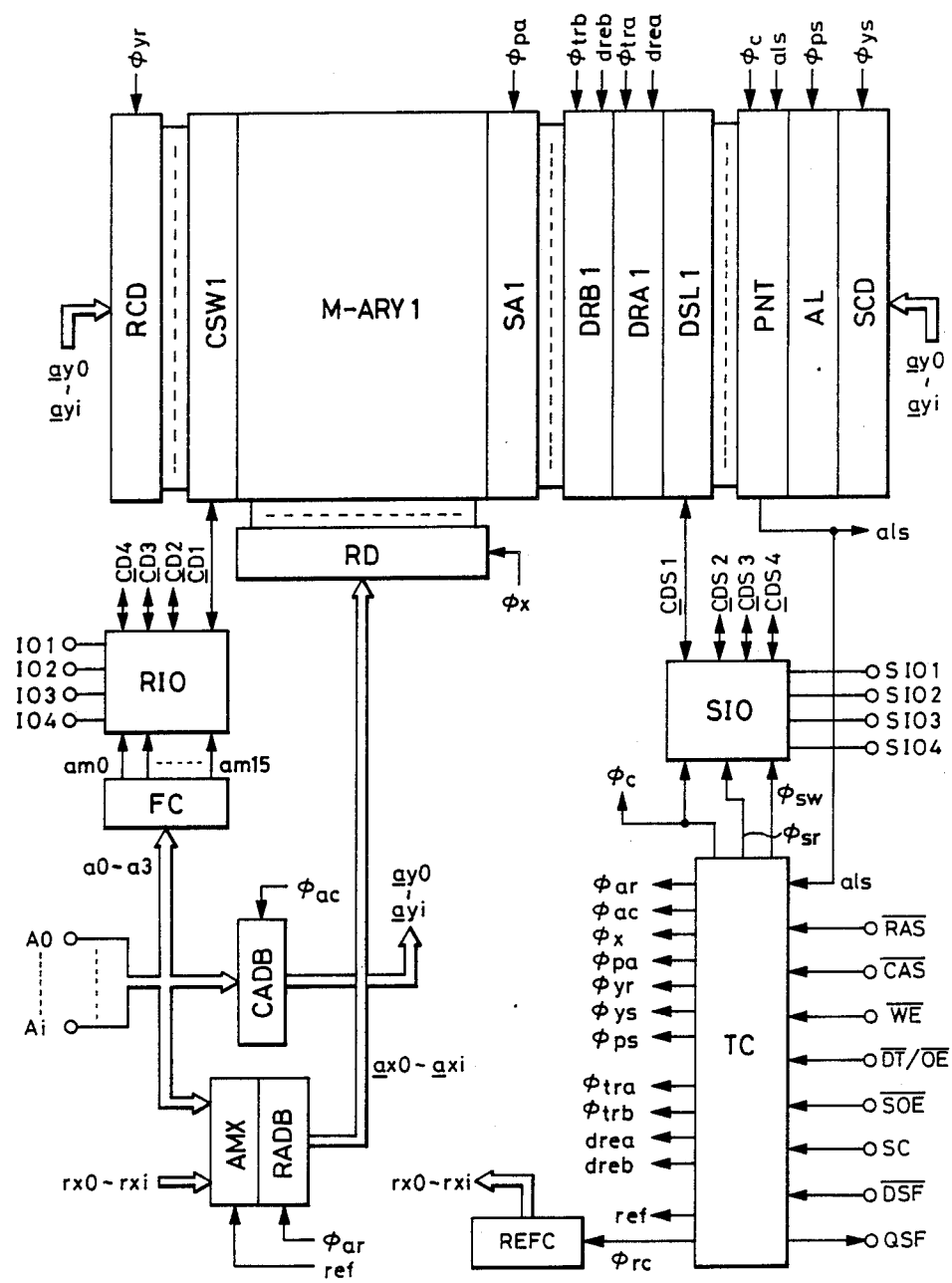
FIG. 2 is a block diagram showing one embodiment of a dual-port memory according to the present invention which includes the data registers shown in FIG. 1.

FIG. 2 is a block diagram of one embodiment of a dual-port memory to which the present invention is applied. The circuit blocks shown in FIG. 2 are formed on a single semiconductor substrate such as single crystal silicon by a known semiconductor integrated circuit manufacturing technique, although the invention is not necessarily limited thereto.

The dual-port memory in accordance with this embodiment has as a basic constituent element a dynamic RAM which includes four memory arrays, and the dual-port memory is provided with a random access port for performing a random input/output operation for storage data in units of 4 bits, and a serial access port for performing a serial input/output operation for storage data for each of the word lines. Thus, the dual-port memory has a function which enables a random access operation to be effected through the random access port while a series of serial input/output operations are being executed through the serial access port.

The serial access port is provided with a serial input/output circuit SIO. Usually, bits of storage data which respectively correspond to the four memory arrays are simultaneously input to or output from the serial input/output circuit SIO through four serial input/output terminals SIO1 to SIO4. In a specific operation mode, this serial access port can be used as a so-called 1-bit access port whereby readout data which are output from the four memory arrays are alternately and serially output through the serial input/output terminal SIO1.

The dual-port memory is supplied with a row address strobe signal $\overline{RAS}$, a column address strobe signal $\overline{CAS}$ and a write enable strobe signal $\overline{WE}$ as control signals from an external unit. The dual-port memory is further supplied with a data transfer control signal $\overline{DT/OE}$ employed to control data transfer between the random access port and the serial access port, a serial input/output control signal $\overline{SOE}$ employed for the input/output control of the serial access port, an initial mode signal $\overline{DSF}$ employed to designate an initial cycle for initial setting, and a serial clock signal SC employed as a synchronizing signal for performing a serial input/output operation in the serial input/output mode. The dual-port memory in accordance with this embodiment is further provided with two data register DRA1 and DRS1 whereby the dual-port memory enables the serial input/output operation to be repeated continuously by alternately using these data registers Therefore, a transfer enable signal QSF is output from the dual-port memory to an external unit, the signal QSF representing the fact that either one of the two data registers is empty and therefore the dual-port memory is ready to start a subsequent serial input/output operation.

Although not necessarily limitative, the dual-port memory in accordance with this embodiment is provided with four memory arrays M-ARY1 to M-ARY4, and sense amplifiers SA1 to SA4 and column switches CSW1 to CSW4 are provided in correspondence with the four memory arrays, respectively. A column address decoder RCD and a row address decoder RD for the random access port are provided in common to the memory arrays M-ARY1 to M-ARY4. There may be provided a plurality of these address decoders in accordance with the layout of the memory arrays on the semiconductor substrate. For purposes of drawing simplification, FIG. 2 exemplarily shows only the memory array M-ARY1 and its peripheral circuits (noting like elements for the unshown memory arrays M-ARY2 to M-ARY4 are referred to with corresponding last numeral such as DRA2, etc.). Referring to FIG. 2, the memory array M-ARY1 consists of m+1 word lines W0 to Wm which are disposed so as to extend vertically as viewed in FIG. 2, n+1 pairs of complementary data lines D0·$\overline{D0}$ to Dn·$\overline{Dn}$ which are disposed so as to extend horizontally, and (m+1)×(n+1) dynamic type memory cells which are respectively disposed at the intersections between the word lines and the complementary data lines (noting that these well-known memory array components are not shown in FIG. 2 for purposes of drawing simplification).

The word lines which constitute the memory array M-ARY1 are coupled to the row address decoder RD, and the one of the word lines which is designated by X-address signals AX0 to AX1 is selectively brought into a select state.

The row address decoder RD decodes complementary internal address signals ax0 to axi (herein and hereinafter, for example, an internal address signal ax0 which is in-phase with an X-address signal AX0 which is externally supplied and an internal address signal $\overline{ax0}$ which is anti-phase with respect to the X-address signal AX0 are in combination referred to as "complementary internal address signal ax0"), and brings a designated word line into a select state which is defined by a high level. The word line selecting operation conducted by the address decoder RD is carried out in synchronism with the rise of a word line select timing signal φx which is supplied from a timing control circuit TC.

The row address buffer RADB receives row address signals supplied from an address multiplexer AMX to form the above-described complementary internal address signals ax0 to axi and supplies them to the row address decoder RD.

The dual-port memory in accordance with this embodiment adopts a so-called address multiplex system in which X-address signals AX0 to AXi for designating row addresses and Y-address signals AY0 to AYi for designating column addresses are supplied through the same external terminals A0 to Ai in a time-division manner. Accordingly, the X-address signals AX0 to AXi are supplied to the external terminals A0 to Ai, respectively, in synchronism with the fall of the row address strobe signal $\overline{RAS}$ which is externally supplied as a control signal, while the Y-address signals AY0 to AYi are supplied to the external terminals A0 to Ai, respectively, in synchronism with the fall of the column address strobe signal $\overline{CAS}$ which is also externally supplied as a control signal. Further, the dual-port memory in accordance with this embodiment is provided with an automatic refresh mode for reading and rewriting storage data in memory cells within a predetermined period. For this purpose, the dual-port memory is provided with a refresh address counter REFC for designating a word line which is to be refreshed in the automatic refresh mode. In addition, the dual-port memory in accordance with this embodiment is provided with an address multiplexer AMX for selectively transmitting refresh address signals rx0 to rxi formed by the refresh address counter REFC and the above-described X-address signals AX0 to AXi to the row address buffer RADB.

The address multiplexer AMX selects the X-address signals AX0 to AXi supplied through the external terminals A0 to Ai in the normal memory access mode in which an internal control signal ref which is supplied from the timing control circuit TC is at a low level, and transmits the selected X-address signals AX0 to AXi to the row address buffer RADB as row address signals. In the automatic refresh mode in which the internal control signal ref is at a high level, the address multiplexer AMX selects the refresh address signals rx0 to rxi output from the refresh address counter REFC and transmits them to the row address buffer RADB as row address signals.

As described above, since the X-address signals AX0 to AXi are supplied to the external terminals A0 to Ai in synchronism with the fall of the row address strobe signal $\overline{RAS}$, the fetching of the row address signals by the row address buffer RADB is effected in accordance with a timing signal $\phi ar$ which is formed in the timing control circuit TC when the fall of the row address strobe signal $\overline{RAS}$ is detected.

On the other hand, the complementary data lines D0·$\overline{D0}$ to Dn·$\overline{Dn}$ in the memory array M-ARY are coupled at one end thereof to corresponding switching MOSFETs, respectively, which constitute in combination the column switch CSW1, and are selectively connected to a complementary common data line CD1 (herein and hereinafter, for example, a non-inverted signal line CD1 and an inverted signal line $\overline{CD1}$ which constitute a first pair of complementary common data lines are in combination referred to as "complementary common data line $\underline{CD1}$") through the switching MOSFETs.

The column switch CSW1 consists of n+1 pairs of switching MOSFETs which are respectively coupled to the corresponding complementary data lines. The other terminals of these switching MOSFETs are coupled in common to either a non-inverted signal line CD1 or an inverted signal line $\overline{CD1}$ which constitute in combination the complementary common data line $\underline{CD1}$. Thus, the column switch CSW1 selectively connects the complementary data lines Do·$\overline{Do}$ to Dn·$\overline{Dn}$ to the common complementary data line $\underline{CD1}$. The gates of two switching MOSFETs which define each of the pairs of the switching MOSFETs which constitute in combination the column switch CSW1 are connected in common to each other and are supplied with a data line select signal which is formed by the column address decoder RCD for the random access port.

The column address decoder RCD for the random access port decodes the complementary internal address signals ay0 to ai0 supplied from a column address buffer CADB to form the above-described data line select signal in accordance with a data line select timing signal $\phi yr$ which is supplied from the timing control circuit TC, and supplies the data line select signal to the column switches CSW1 to CSW4.

The column address buffer CADB samples and holds the Y-address signals AY0 to AYi supplied through the external terminals A0 to Ai in accordance with a timing signal $\phi ac$ which is formed in the timing control circuit TC when the fall of the column address strobe signal $\overline{CAS}$ is detected. The column address buffer CADB further forms the complementary internal address signals ay0 to ayi on the basis of these Y-address signals AY0 to AYi and supplies them to the column address decoder RCD for the random access port. These complementary internal address signals ay0 to ayi are also supplied to the column address decoder $\overline{SCD}$ for the serial access port (described later).

The complementary data lines D0·$\overline{D0}$ to Dn·$\overline{Dn}$ in the memory array M-ARY1 are coupled at the other ends thereof to corresponding unit circuits, respectively, which constitute in combination the sense amplifier SA1, and are further coupled to corresponding unit circuits which constitute the two data registers DR1A and DR1B which are provided for the serial access port.

Each of the unit circuits of the sense amplifier SA1 includes as a basic constituent element a latch which is defined by a pair of cross-coupled CMOS inverter circuits. The unit circuits of the sense amplifier SA1 are simultaneously activated in synchronism with the rise of a timing signal $\phi pa$ supplied from the timing control circuit TC, to amplify minute readout signals output from memory cells to the corresponding complementary data lines, thus forming binary signals having a high or low level.

The complementary common data line $\underline{CD1}$ to which a pair of designated complementary data lines are selectively connected through the column switch CSW1 is coupled to a random input/output circuit RIO. To the random input/output circuit RIO are similarly coupled complementary common data lines $\underline{CD2}$ to $\underline{CD4}$ which are provided in correspondence with the memory arrays M-ARY2 to M-ARY4.

The random input/output circuit RIO is selectively activated in response to the rise of a timing signal $\phi rw$ which is supplied from the timing control circuit TC in the random access port write operation mode of the dual-port memory, to transmit write data supplied from an external unit through input/output terminals IO1 to IO4 to the complementary common data lines $\underline{CD1}$ to $\underline{CD4}$ in the form of complementary write signals In the random access port read operation mode of the dual-port memory, the random input/output circuit RIO is selectively activated in response to the rise of a timing signal $\phi rr$ supplied from the timing control circuit TC, to further amplify the readout signals transmitted through the complementary common data lines $\underline{CD1}$ to $\underline{CD4}$ and deliver them from the input/output terminals I01 to I04 ($\phi rw$ and $\phi rr$ are not illustrated in FIG. 2 for purposes of drawing simplification). Further, the random input/output circuit RIO has various arithmetic functions for performing raster calculation or the like. The mode of an arithmetic operation carried out by the random input/output circuit RIO is designated by arithmetic mode signals am0 to am15 which are supplied from a function control circuit FC.

The function control circuit FC includes a register which takes in and holds arithmetic code signals supplied through the external terminals A0 to A3, and a decoder which decodes these arithmetic code signals and selectively forms the above-described arithmetic mode signals am0 to am15. The arithmetic code signals are supplied to the dual-port memory through the external terminals A0 to A3 in an arithmetic mode setting cycle wherein the column address strobe signal $\overline{CAS}$ is changed to the low level prior to the row address strobe signal $\overline{RAS}$ and, at the same time, the write enable signal $\overline{WE}$ is changed to the low level.

On the other hand, the serial access port of the dual-port memory in accordance with this embodiment consists of n+1 bit data registers DRA1 to DRA4 and DRB1 to DRB4 and data selectors DSL1 to DSL4 which are provided in correspondence with the complementary data lines in the four memory arrays, a pointer PNT which is provided in common to the data registers and the data selectors, a column address decoder SCD for the serial access port, and a serial input/output circuit SIO. It should be noted that there may be provided a plurality of pointers PNT and a plurality of column address decoders SCD in accordance with the layout of the memory arrays on the semiconductor substrate FIG. 2 exemplarily shows the data registers DRIA, DRIB and the data selector DSL1 which correspond to the memory array M-ARY1.

Referring to FIG. 2, each of the data registers DRA1 and DRB2 includes n+1 flip-flops which are provided in correspondence with the complementary data lines in the memory array M-ARY1 as described later. There are provided n+1 pairs of switching MOSFETs for data transfer between the input and output nodes of these flip-flops and the non-inverted and inverted signal lines of the corresponding complementary data lines, respectively. Among these switching MOSFETs for data transfer, the MOSFETs which correspond to the data register DRA1 are simultaneously turned on in synchronism with the rise of a data transfer timing signal $\phi$tra supplied from the timing control circuit TC. The data transfer switching MOSFETs which correspond to the data register DRB1 are simultaneously turned on in synchronism with the rise of a data transfer timing signal $\phi$trb supplied from the timing control circuit TC.

The bits in the data registers DRA1 and DRB1 are selectively coupled to the corresponding switching MOSFETs in the data selector DSL1 through n+1 pairs of switching MOSFETs provided in correspondence with the bits, respectively. The switching MOSFETs in the data registers DRA1 and DRB1 are simultaneously turned on in accordance with internal control signals drea or dreb which are supplied from the timing control circuit TC in complementary relation to each other.

Practical circuit configurations and operations of the data registers DRA1 and DRB1 will be described later in detail.

The data selector DSL1 consists of n+1 switching MOSFETs and selectively connects the bits in the data register DRA1 or DRB1 to a serial input/output complementary common data line CDS1. The gates of each of the pairs of switching MOSFETs of the data selector DSL1 are connected in common to each other and are supplied with the corresponding data register select signals S0 to Sn from the pointer PNT.

The pointer PNT is defined by a n+1 bit shift register in which an output terminal als for the final bit is coupled to an input terminal for the top bit. In the serial input/output mode of the dual-port memory, the pointer PNT performs a looped shift operation in accordance with a shift timing signal $\phi$c supplied from the timing control circuit TC. The bits in the pointer PNT are further coupled to the corresponding bits, respectively, in an address latch AL.

The address latch AL consists of n+1 latches which are respectively provided in correspondence with the bits in the pointer PNT. The input terminals of these latches are respectively coupled to the corresponding output terminals of the column address decoder SCD for the serial access port, while the output terminals of the latches are respectively coupled to the corresponding bit input terminals of the pointer PNT. A high-level select signal is selectively output to the one of the output terminals of the serial access port column address decoder SCD which corresponds to the top column address designated by the Y-address signals AY0 to AYi. The address latch AL takes in and holds the above-described select signal which is output from the column address decoder SCD in synchronism with a timing signal $\phi$ys. The address latch AL outputs said select signal to the corresponding bit in the pointer P in accordance with a timing signal $\phi$ps supplied from the timing control circuit TC.

The column address decoder SCD for the serial access port decodes the complementary internal address signals ay0 to ayi supplied from the column address buffer $\overline{CADB}$ to selectively form a high-level select signal and outputs the select signal to the corresponding bit in the address latch AL.

More specifically, in the serial input/output mode of the dual-port memory, the column address of the storage data which is to be output first, i.e., the top column address, is designated by the Y-address signals AY0-AYi, that is, the complementary internal address signals ay0 to ayi. These complementary internal address signals ay0 to ayi are decoded by the column address decoder SCD for the serial access port, and a high-level select signal is input to that bit in the address latch AL which corresponds to the top column address in accordance with the timing signal $\phi$ys. This select signal is input to the corresponding bit in the pointer PNT in accordance with the timing signal $\phi$ps to become a shift signal of the logic "1".

When a serial input/output operation for storage data is started in the dual-port memory, the pointer PNT is supplied with the shift timing signal $\phi$c from the timing control circuit TC. The "1" shift signal written in the designated bit in the pointer PNT is shifted in the form of a loop within the pointer PNT in synchronism with every trailing edge of the timing signal $\phi$c. Thus, the data selector DSL1 is supplied with high-level data register select signals in order from the switching MOSFET which corresponds to the top column address, and the complementary data lines are connected to the serial input/output complementary common data line CDS1 in order from the complementary data line corresponding to the top column address In other words, the dual-port memory in accordance with this embodiment enables a storage data serial input/output operation to be started from a desired column address. Although not necessarily limitative, the storage data serial input/output operation carried out in the dual-port memory of this invention is ended at the final column address n, that is, the column address n is the end column address.

The serial input/output complementary common data line CDS1 is coupled to the serial input/output circuit SIO. To the serial input/output circuit SIO are similarly coupled serial input/output complementary common data lines C̲D̲S̲2 to C̲D̲S̲4 which are provided in correspondence with the memory arrays M-ARY2 to M-ARY4, respectively.

The serial input/output circuit SIO includes four sets of main amplifiers, data input buffers and data output buffers which are provided in correspondence with the serial input/output complementary common data lines C̲D̲S̲1 to C̲D̲S̲4 and serial input/output terminals SIO1 to SIO4, respectively. The data output buffers are, in the serial output mode of the dual-port memory, activated in response to the rise of a timing signal φsr supplied from the timing control circuit TC to deliver readout data output from the corresponding serial input/output complementary common data lines C̲D̲S̲1 to C̲D̲S̲4 through the corresponding main amplifiers to the corresponding serial input/output terminals SIO1 to SIO4, respectively, in synchronism with the leading edge of the timing signal φc. The data input buffers in the serial input/output circuit SIO are, in the serial input mode of the dual-port memory, activated in response to the rise of a timing signal φsw supplied from the timing control circuit TC to form complementary write signals on the basis of write data supplied from an external unit through the corresponding serial input/output terminals SIO1 to SIO4 and transmit the complementary write signals to the corresponding serial input/output complementary common data lines C̲D̲S̲1 to C̲D̲S̲4 in synchronism with the leading edge of the timing signal φc.

The timing control circuit TC from the abovedescribed various timing signals and internal control signals on the basis of the row address strobe signal $\overline{RAS}$, column address strobe signal $\overline{CAS}$, write enable signal $\overline{WE}$, data transfer control signal $\overline{DT/OE}$, serial input/output control signal $\overline{SOE}$ and initial mode signal $\overline{DSF}$ which are externally supplied as control signals, and supplies these signals to the various circuits. The timing control circuit TC further forms the timing signal φc for synchronizing the serial input/output operation of the serial access port on the basis of the serial clock signal SC which is externally supplied, and supplies the timing signal φc to the pointer PNT and the serial input/output circuit SIO. Further, the timing control circuit TC has a data register control function for alternately using the two sets of data registers DRA1 to DRA4 and DRB1 to DRB4. For this purpose, the timing control circuit TC is supplied with the output signal als from the final bit in the pointer PNT. The timing control circuit TC forms the above-described internal control signals drea, dreb and timing signals φtra, φtrb for selecting data registers in accordance with the abovedescribed control signals and the output signal als from the pointer PNT, and also forms a transfer enable signal QSF and outputs it to an external unit through an external terminal QSF.

Figure 1:
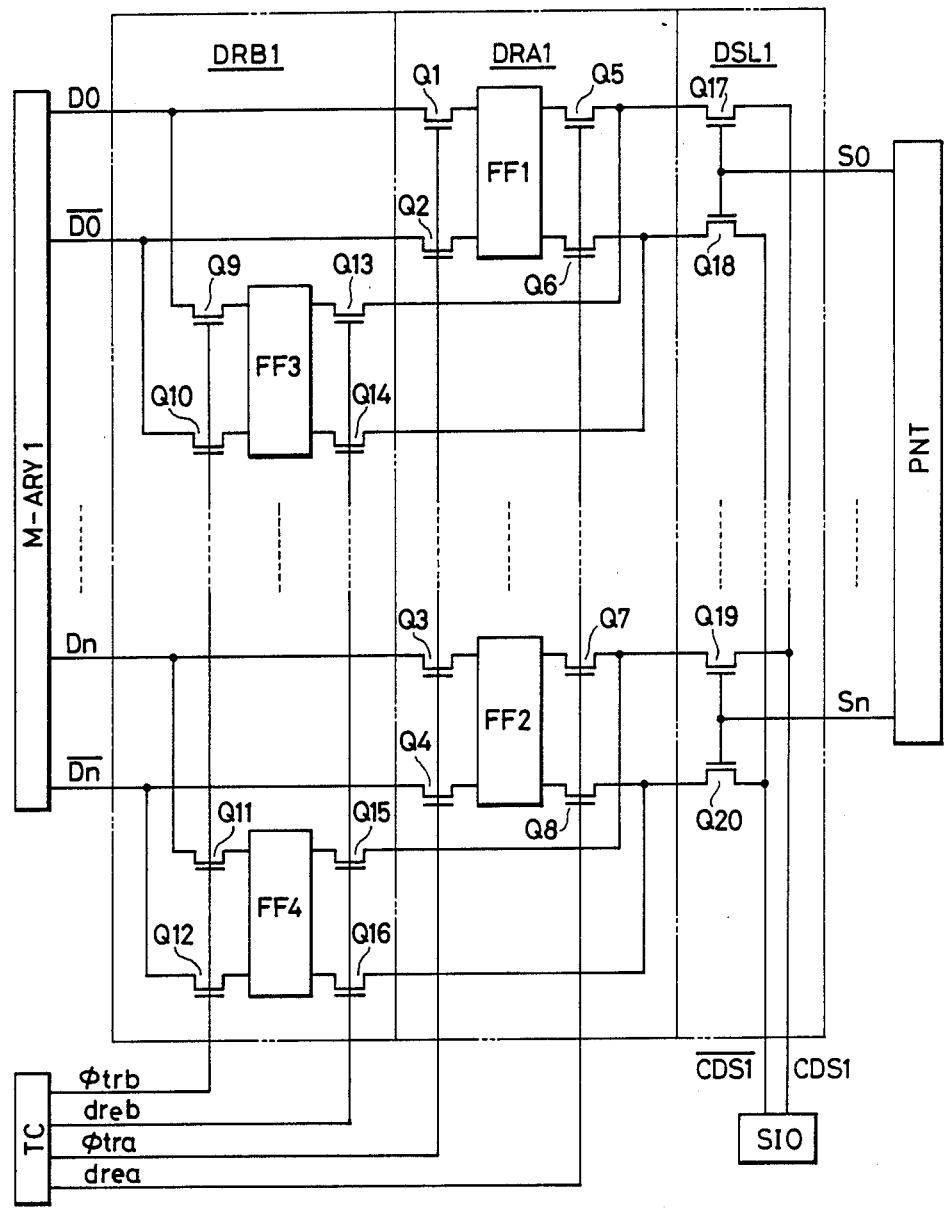
FIG. 1 is a circuit diagram showing one example of data registers of a dual-port memory to which the present invention is applicable.

FIG. 1 is a circuit diagram of one example of the data registers DRA1 and DRB1 in the dual-port memory shown in FIG. 2. The data registers DRA2 to DRA4 and DRB2 to DRB4 also have the same circuit configuration as that of the data registers DRA1 and DRB1 shown in FIG. 1. The circuit configuration and operation of the data registers will roughly be explained below with the data registers DRA1 ah DRB1 taken as one example. It should be noted that the MOSFETS shown in FIG. 1 are all N-channel MOSFETS although the invention is not limited to this.

Referring to FIG. 1, the n+1 pairs of complementary data lines D0·$\overline{D0}$ to Dn·$\overline{Dn}$ which constitute in combination the memory array M-ARY1 are respectively coupled to the corresponding flip-flops FF1 to FF2 of the data register DRA1 through the corresponding data transfer switching MOSFETs Q1·Q2 to Q3·Q4, and are also respectively coupled to the corresponding flip-flops FF3 to FF4 of the data register DRB1 through the corresponding data transfer switching MOSFETs Q9·Q10 to Q11·Q12 which are similar to the switching MOSFETs Q1·Q2 to Q3·Q4. The n+1 flip-flops FF1 to FF2 of the data register DRA1 are further coupled to the corresponding switching MOSFETs Q17·Q18 to Q19·Q20 of the data selector DSL1 through the corresponding switching MOSFETs Q5·Q6 to Q7·Q8, respectively. Similarly, the n+1 flip-flops FF3 to FF4 of the data register DRB1 are further coupled to the corresponding switching MOSFETs Q17·Q18 to Q19·Q20 of the data selector DSL1 through the corresponding switching MOSFETs Q13·Q14 to Q15·Q16, respectively.

The gates of the data transfer switching MOSFETs Q1·Q2 to Q3·Q4 of the data register, DRA1 are all connected in common to each other and supplied with the data transfer timing signal φtra from the timing control circuit TC. Similarly, the gates of the data transfer switching MOSFETs Q9 Q10 to Q11·Q12 of the data register DRB1 are all connected in common to each other and supplied with the data transfer timing signal φtrb from the timing control circuit TC. These timing signals φtra and φtrb are normally held at the low level and selectively raised to the high level in a data transfer cycle in the serial input/output mode of the dual-port memory. When either the timing signal φtra or φtrb is raised to the high level, the switching MOSFETs Q1·Q2 to Q3·Q4 or Q9·Q10 to Q11·Q12 are simultaneously turned on, and parallel transfer of storage data is thereby effected between the n+1 flip-flops of the data register DRA1 or DRB1 and the n+1 memory cells coupled to the selected word line.

On the other hand, the gates of the switching MOSFETs Q5·6Q to Q7·Q8 of the data register DRA1 are all connected in common to each other and mutually supplied with the internal control signal drea from the timing control circuit TC. Similarly, the gates of the switching MOSFETs Q13·Q14 to Q15·Q16 of the data register DRB1 are all connected in common to each other and mutually supplied with the internal control signal dreb from the timing control circuit TC. These internal control signals drea and dreb are normally held at the low level and selectively raised to the high level during a serial input/output operation of the dual-port memory in the serial input/output mode. When either the internal control signal drea or dreb is raised to the high level, the switching MOSFETs Q5·Q6 to Q7·Q8 or Q13·Q14 to Q15·Q16 are simultaneously to FF4 of the data register DRA1 or DRB1 are thereby connected to the corresponding switching MOSFETs, respectively.

The data selector DSL1 consists of n+1 pairs of switching MOSFETs Q17·Q18 to Q19·Q20 which are provided in correspondence with the complementary data lines D0·$\overline{D0}$ to Dn·$\overline{Dn}$ in the memory array M-ARY1. One end of each pair of the switching MOSFETs is coupled to the corresponding bits in the data registers DRA1 and DRB1, while the other ends of each pair of switching MOSFETs are mutually coupled to the non-inverted signal line CDS1 and inverted signal lines CDS1, respectively, which constitute in combination the serial input/output complementary common data lines. The gates of each pair of switching MOSFETs Q17·Q18 to Q19·Q20 are connected in common to each other, and the mutually connected gates of the pairs of switching MOSFETs are respectively supplied with the corresponding data register select signals S0 to Sn from the pointer PNT. These data register select signals S0 to Sn are normally held at the low level and selectively and sequentially raised to the high level during a serial input/output operation of the dual-port memory in the serial input/output mode. The switching MOSFETs Q17·Q18 to Q19·Q20 of the data selector DSL1 are selectively turned on in response to the rise of the corresponding data register select signals, thereby selectively connecting the corresponding flip-flops in the data register DRA1 or DRB1 to the serial input/output complementary common data lines CDS1·$\overline{CDS1}$.

As described above, the flip-flops FF1 to FF2 and FF3 to FF4 in the data registers DRA1 and DRB1 are selectively connected to the corresponding complementary data lines D0·$\overline{D0}$ to Dn·$\overline{Dn}$ in accordance with the timing signal φtra or φtrb. The flip-flops FF1 to FF2 and FF3 to FF4 in the data register DRA1 and DRB1 are selectively connected to the corresponding switching MOSFETs Q17·Q18 to Q19·Q20 of the data selector DSL1 in accordance with the internal control signal drea or dreb and further connected to the serial input/output complementary common data lines CDS1·$\overline{CDS1}$. In other words, the data registers DRA1 and DRB1 are able to be employed while being alternately switched from one to the other in accordance with particular use conditions. More specifically, when one of the data registers DRA1 and DRB1 is connected to the serial input/output complementary common data lines CDS1·$\overline{CDS1}$ and a storage data serial input/output operation is being performed, it is possible to execute parallel transfer of storage data between the other data register and a plurality of memory cells coupled to a selected word line by coupling the second data register to the memory array M-ARY1. In other words, while a storage data serial input/output operation is being carried out through one data register, parallel transfer of storage data can be performed through the other data register, and it is therefore possible to accept the start of a subsequent serial input/output operation in an overlapping manner.

Figure 6:
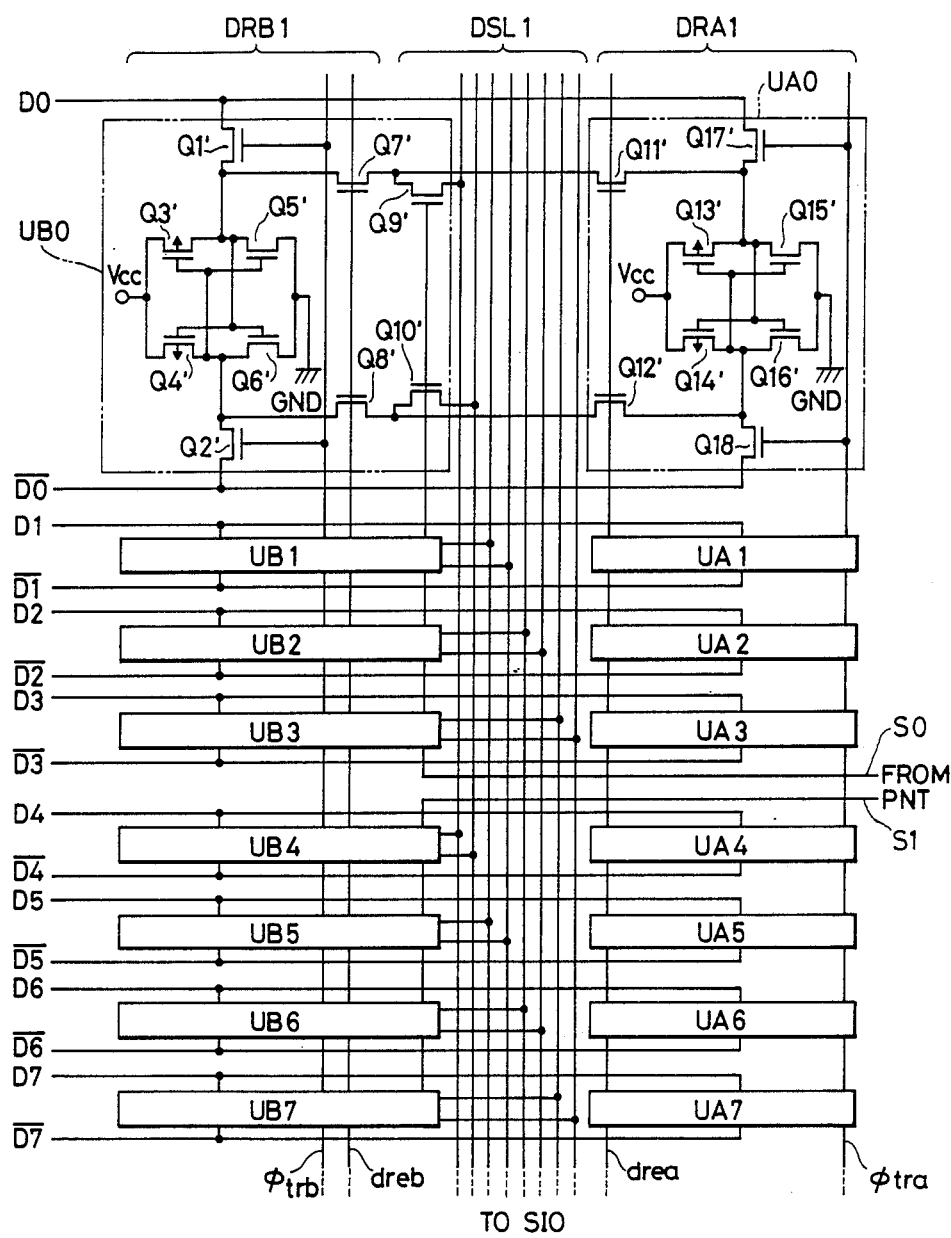
FIG. 6 is a circuit diagram showing another example of registers of the dual-port memory to which the present invention is applied.

FIG. 6 shows another example of the arrangement of the data registers DRA1, DRB1 and the data selector DSL1. In this example, these circuits are arranged so that it is possible to serially input and output information consisting of 4 bits. The data register DRA1 consists of a plurality of unit data registers UA0, UA1, ... UA7, and the data register DRB1 also consists of a plurality of unit data registers UB0, UB1, ... UB7. The unit data registers are connected to the corresponding data line pairs D0, $\overline{D0}$, ... D7, $\overline{D7}$, respectively. In order to output or input 4 bits of information at a time, one select signal, e.g., S0, which is delivered from the pointer PNT is employed in common to four data line pairs D0, $\overline{D0}$, ... D3, $\overline{D3}$. The unit data register UA0 is provided therein with a flip-flop composed of MOSFETs Q13' to Q16', switching MOSFETs Q17', Q18' for coupling the flip-flop to the data line pair D0, $\overline{D0}$, and switching MOSFETs Q11', Q12' for coupling the flip-flop to the data selector DSL1. The unit data register UB0 is provided therein with a flip-flop composed of MOSFETs Q3' to Q6', switching MOSFETs Q1', Q2' for coupling the flip-flop to the data line pair D0, $\overline{D0}$, and switching MOSFETs Q7', Q8', Q9' and Q10' for coupling the flip-flop to the data selector DSL1.

Figure 3:
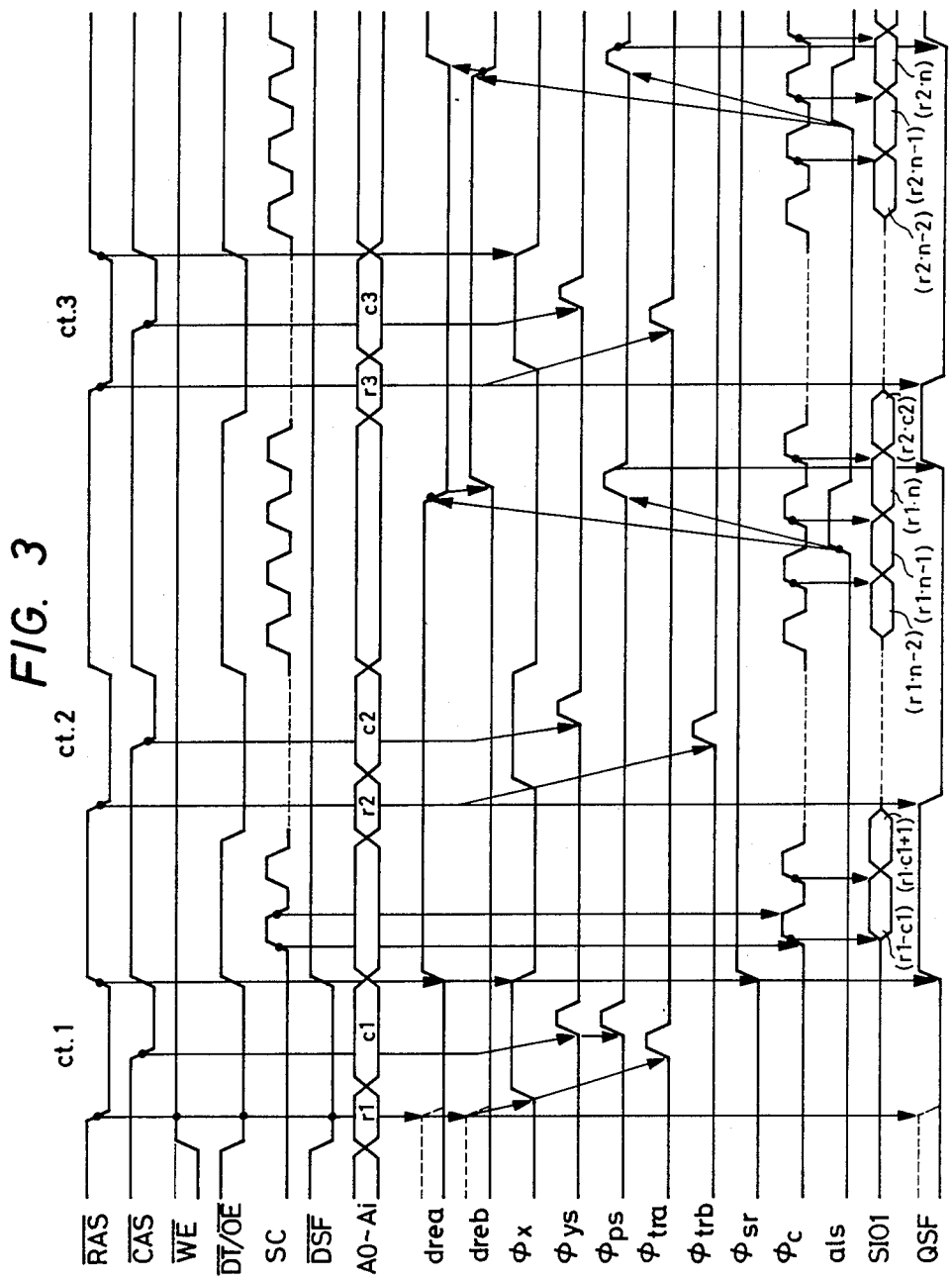
FIG. 3 is a timing chart showing one example of the serial output mode of the dual port memory shown in FIG. 2.
Figure 4:
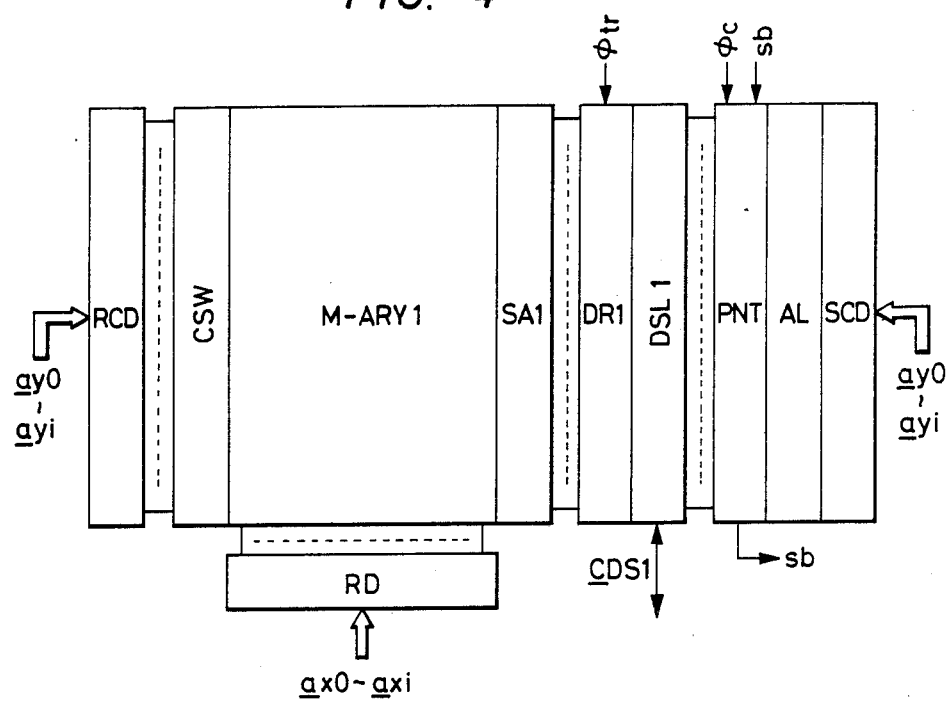
FIG. 4 is a block diagram showing one example of conventional dual port memories.
Figure 5:
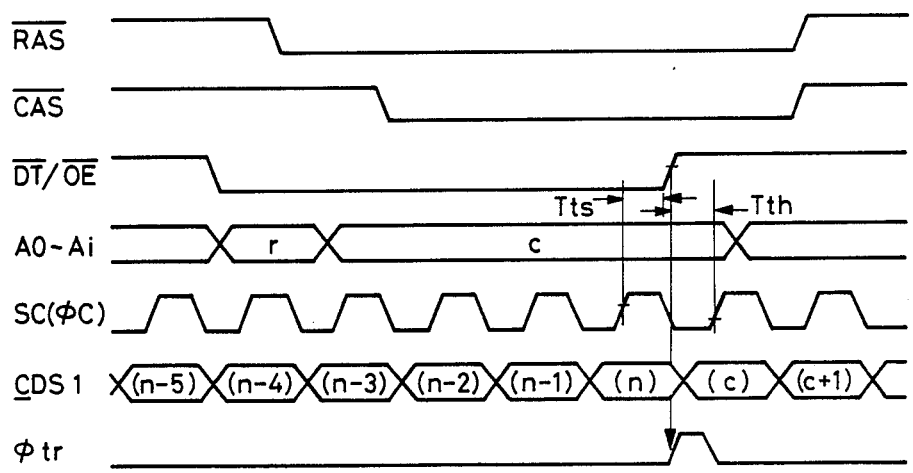
FIG. 5 is a timing chart showing one example of the serial output mode of the dual-port memory shown in FIG. 4.

FIG. 3 is a timing chart showing one example of the operation of the dual-port memory in the serial output mode. FIG. 3 exemplarily shows three serial output operations which are continuously conducted immediately after the power supply of the dual-port memory has been turned on or after the serial clock signal SC has been cut off. The outline of the serial output mode of the dual-port memory in accordance with this embodiment will be described below with reference to this timing chart.

In the serial output mode of the dual-port memory in accordance with this embodiment, one word line is first selected in a readout data transfer cycle, and bits of data stored in the n+1 memory cells coupled to the selected word line are transferred to either the data register DRA1 or DRB1 in parallel. This readout data transfer cycle is executed while a serial output operation for the readout data in the previous serial output mode is being conducted. In this dual-port memory, when a readout data transfer cycle is completed, the memory is released for a time and then resumes the serial output operation for the previous serial output mode. When this serial output operation is completed, the dual-port memory starts a serial output operation for the storage data read out and input to the other data register by the readout data transfer cycle during said serial output operation.

In this dual-port memory, at the point of time when a serial output operation is started, the transfer enable signal QSF is raised to the high level to inform an external unit that a subsequent serial output mode is acceptable. When a readout data transfer cycle for the subsequent serial output mode has been started in response to the rise of the transfer enable signal QSF, the dual-port memory changes the transfer enable signal QSF to the low level. During the time interval from the start of this readout data transfer cycle to the completion of the serial output operation in the previous serial output mode, the transfer enable signal QSF is held at the low level, and no new serial output mode is therefore acceptable during this period of time. Immediately after the power supply of the dual-port memory has been turned on or after the serial clock signal SC has been cut off, the state of the transfer enable signal QSF is not fixed and the internal state of the dual-port memory is unsettled. Therefore, in the dual-port memory in accordance with this embodiment, an initial mode signal $\overline{DSF}$ is provided, and when this initial mode signal $\overline{DSF}$ is at a low level, a readout data transfer cycle is accepted irrespective of the state of the transfer enable signal QSF, thereby initializing and normalizing the internal state of the dual-port memory.

Referring to FIG. 3, the dual-port memory is started in response to the fall of the row address strobe signal $\overline{RAS}$ supplied as a control signal. In a first readout data transfer cycle Ct·1, prior to the fall of the row address strobe signal $\overline{RAS}$, the write enable signal $\overline{WE}$ is raised to the high level, while the data transfer control signal $\overline{DT/OE}$ is changed to the low level, and the initial mode signal $\overline{DSF}$ is also changed to the low level. Further, the external terminals A0 to Ai are supplied with a row address r1 representative of a word line to be selected in the form of the X-address signals AX0 to AXi.

In this dual-port memory, the initial mode signal $\overline{DSF}$ has already been changed to the low level when the row address strobe signal $\overline{RAS}$ falls, and therefore the readout data transfer cycle Ct·1 is accepted unconditionally irrespective of the state of the transfer enable signal QSF. In consequence, predetermined control flip-flops within the timing control circuit TC are simultaneously reset as shown by the chain line in FIG. 3, and the internal state of the dual-port memory is thereby initialized.

In this dual-port memory, the timing signal $\phi ar$ (not shown) is temporarily raised to the high level in response to the fall of the row address strobe signal $\overline{RAS}$. At this time, the internal control signal ref is changed to the low level. In consequence, the X-address signals AX0 to AXi are input to the row address buffer RADB, supplied to the row address decoder RD in the form of the complementary internal address signals ax0 to axi and decoded therein. Slightly after the rise of the timing signal $\phi ar$, the timing signal $\phi x$ is raised to the high level, and the word line Wr1 corresponding to the row address r1 is thereby brought into a select state which is defined by a high level. Further, slightly after the rise of the timing signal $\phi x$, the timing signal $\phi pa$ (not shown) is raised to the high level, and minute readout signals output from the n+1 memory cells coupled to the selected word line Wr1 are thus amplified by the corresponding unit circuits, respectively, of the sense amplifier SA1. At the time when the amplifying operation carried out by the sense amplifier SA1 is completed, the data transfer timing signal $\phi tra$ is temporarily raised to the high level Consequently, the bits of data which have been output to the complementary data lines D0·$\overline{D0}$ to Dn·$\overline{Dn}$ in the memory array M-ARY1 and respectively amplified in the corresponding unit circuits of the sense amplifier SA1 are input to and held in the flip-flops FF1 to FF2 in the data register DRA1 at the corresponding bits.

Then, the column address strobe signal $\overline{CAS}$ is changed from the high level to the low level. Prior to the fall of this column address strobe signal $\overline{CAS}$, a top column address c1 is supplied to the external terminals A0 to Ai in the form of the Y-address signals AY0 to AYi.

In this dual-port memory, the timing signal $\phi ac$ (not shown) is temporarily raised to the high level in response to the fall of the column address strobe signal $\overline{CAS}$. In consequence, the Y-address signals AY0 to AYi are input to and held in the column address buffer CADB. Since the data transfer control signal $\overline{DT/OE}$ is at the low level when the column address strobe signal $\overline{CAS}$ falls, the complementary internal address signals ay0 to ayi are sent to the column address decoder SCD for the serial access port and decoded therein. Slightly after the rise of the timing signal $\phi ac$, the timing signals $\phi ys$ and $\phi ps$ are temporarily raised to the high level at the same time. Consequently, a shift signal of the logic "1" is set at the bit in the pointer PNT which corresponds to the top column address c1 from the serial access port column address decoder SCD through the address latch AL.

Then, the row address strobe signal $\overline{RAS}$ is returned to the high level, and the serial clock signal SC is supplied after a predetermined period of time has elapsed thereafter.

In this dual-port memory, in response to the rise of the row address strobe signal $\overline{RAS}$, the first readout data transfer cycle Ct·1 in the serial output mode is ended, and both the internal control signal drea and the timing signal $\phi sr$ are raised to the high level. In consequence, the bits in the data register DRIA are respectively connected to the corresponding switching MOSFETs in the data selector DSL1, and the serial input/output circuit SIO is activated. Thus, the readout data corresponding to the top column address is input to the data buffer in the serial input/output circuit SIO through the serial input/output complementary common data line CDS1. Further, in response to the rise of the row address strobe signal $\overline{RAS}$, the transfer enable signal QSF is raised to the high level to inform an external unit that the dual-port memory is ready to accept a subsequent readout data transfer cycle. During the serial output mode operation which is continuously carried out thereafter, the initial mode signal $\overline{DSF}$ is held at the high level, and a read-out data transfer cycle is accepted by the dual-port memory only when the transfer enable signal QSF is at the high level.

In this dual-port memory, further, the timing signal $\phi c$ is formed in synchronism with the serial clock signal SC, and in synchronism with the first leading edge of this timing signal $\phi c$, the first readout data, i.e., the readout data (r1·c1) output from that memory cell on the word line Wr1 which corresponds to the column address c1, is input to the data latch in the serial input/output circuit SIO and delivered from the serial input/output terminal SIO1. Thereafter, the shift signal within the pointer PNT is shifted in synchronism with every trailing edge of the timing signal $\phi c$, and the bits in the data register DRA1 are sequentially connected to the serial input/output complementary common data line CDS1. The readout data output from each of the bits in the data register DRA1 is input to the data latch in the serial input/output circuit SIO in synchronism with the leading edge of the timing signal $\phi c$. Thus, bits of readout data (r1·c1+1) to (ri·n) output from the following memory cells are sequentially delivered to the serial input/output terminal SIO1.

While the readout data serial output operation in the first serial output mode is being executed, the transfer enable signal QSF is raised to the high level, and consequently, the row address strobe signal $\overline{RAS}$ is changed to the low level, thus starting a readout data transfer cycle Ct·2 for designating a second serial output mode. Prior to the fall of the row address strobe signal $\overline{RAS}$, the data transfer control signal $\overline{DT/OE}$ is changed to the low level, and the external terminals A0 to Ai are supplied with a row address r2 of a word line which is to be selected in the second place.

In this dual-port memory, in response to the fall of the row address strobe signal $\overline{RAS}$, the transfer enable signal QSF is first changed to the low level. The transfer enable signal QSF is held at the low level until the first serial output mode is completed, and in the meantime no new readout data transfer cycle is accepted. Further, in this dual-port memory a word line select operation similar to the first readout data transfer cycle Ct·1 proceeds, and readout signals corresponding to the bits of storage data output from the n+1 memory cells coupled to the word line Wr2 are thus amplified in the corresponding unit circuits of the sense amplifier SA1. At the point of time when this amplifying operation is completed, the data transfer timing signal $\phi trb$ is temporarily raised to the high level, and the n+1 bit readout signals which have been amplified by the sense amplifier SA1 are transferred to the other data register DRB1.

Next, the column address strobe signal $\overline{CAS}$ is changed from the high level to the low level. Prior to the fall of the column address strobe signal $\overline{CAS}$, the top column address c2 is supplied to the external terminals A0 to Ai.

In this dual-port memory, in response to the fall of the column address strobe signal $\overline{CAS}$, the top column address c2 is input to the column address buffer CADB and decoded by the column address decoder SCD for the serial access port. At the point of time when this decoding operation is completed, the timing signal $\phi ys$ alone is temporarily raised to the high level, and a high-level select signal is input to and held at that bit in the address latch AL which corresponds to the top column address c2. This select signal is held in the address latch AL until the column address strobe signal $\overline{CAS}$ is changed to the low level in the subsequent data transfer cycle and the timing signal $\phi ys$ is temporarily raised to the high level again after a new column address has been decoded. Thus, the address latch AL functions as a register for holding the top column address when the top column address is not changed in the subsequent data transfer cycle.

Next, the row address strobe signal $\overline{RAS}$, column address strobe signal $\overline{CAS}$ and data transfer control signal $\overline{DT/OE}$ are returned to the high level. Thus, the dual-port memory ends the readout data transfer cycle Ct-2 for the second serial output mode. During this readout data transfer cycle Ct-2, the readout data serial output operation in relation to the first serial output mode is continued without a stop.

Thus, the serial output operation in the first serial output mode proceeds, and when that bit in the data register DRA1 which corresponds to the final column address n is selected, the output signal als from the final bit of the pointer PNT is raised to the high level. In consequence, the timing signal $\phi ps$ is temporarily raised to the high level in synchronism with a subsequent fall of the serial clock signal SC. Further, the internal control signal drea is changed to the low level, and the internal control signal dreb is raised to the high level instead after a predetermined delay time has elapsed thereafter. In consequence, the high-level select signal held in the address latch AL is set to the corresponding bit in the pointer PNT in the form of a shift signal of the logic "1", and the data register select signal corresponding to the top column address c2 is selectively raised to the high level. In addition, the switch MOSFETs Q5 to Q8 in the data register DRA1 are turned off, while the switching MOSFETs Q13 to Q16 in the data register DRBL are simultaneously turned on, so that the bits in the data register DRB1 are respectively connected to the corresponding switching MOSFETs in the data selector DSL1. In consequence, among the readout data held in the data register DRB1, the readout data corresponding to the top column address c2 is input to the data buffer in the serial input/output circuit SIO through the serial input/output complementary common data line $\overline{CDS1}$. Further, in the dual-port memory, the transfer enable signal QSF is raised to the high level in response to the trailing edge of the timing signal $\phi ps$, thus informing the external unit that the dual-port memory is ready to accept a subsequent readout data transfer cycle.

In this dual-port memory, in response to a subsequent leading edge of the timing signal $\phi c$ formed on the basis of the serial clock signal SC supplied continuously, the first readout data in the second serial output mode, i.e., the readout data (r2·c2) output from the memory cell on the word line Wr2 which corresponds to the column address c2, is input to the data latch in the serial input-/output circuit SIO and delivered from the serial input-/output terminal SIO1. Thereafter, the shift signal in the pointer PNT is shifted in synchronism with every trailing edge of the timing signal $\phi c$, and the bits in the data register DRB1 are thereby sequentially connected to the serial input/output complementary common data line $\overline{CDS1}$. The readout data output from each of the bits in the data register DRB1 is input to the data latch in the serial input/output circuit SIO in synchronism with every leading edge of the timing signal $\phi c$. Thus, bits of readout data (r2·c2+1) to (r2·n) output from the following memory cells are sequentially delivered to the serial input/output terminal SIO1.

When the word address strobe signal $\overline{RAS}$ is changed to the low level in response to the rise of the transfer enable signal QSF, a readout data transfer cycle Ct-3 for designating a third serial output mode is started. Prior to the fall of the row address strobe signal $\overline{RAS}$, the data transfer control signal $\overline{DT/OE}$ is changed to the low level, and the external terminals A0 to Ai are supplied with a row address r3 of a word line which is to be selected in the third place.

In this dual-port memory, the transfer enable signal QSF is held at the low level during the time interval from the fall of the row address strobe signal $\overline{RAS}$ to the completion of this serial output mode, thereby inhibiting the acceptance of any new readout data transfer cycle. Further, a word line select operation is conducted and bits of readout data output from the n+1 memory cells coupled to the word line Wr3 are amplified by the sense amplifier SA1. At the point of time when this amplifying operation is completed, the data transfer timing signal $\phi tra$ is temporarily raised to the high level, and the readout data is input to the data register DRA1 which was employed for the first serial output operation.

Next, the column address strobe signal $\overline{CAS}$ is changed from the high level to the low level and, consequently, the top column address c3 which is supplied through the external terminals A0 to Ai is input to and decoded by the column address decoder SCD for the serial access port. Further, the timing signal $\phi ys$ alone is temporarily raised to the high level, and a high-level select signal is input to and held at the bit in the address latch AL which corresponds to the top column address c3.

When the row address strobe signal $\overline{RAS}$, column address strobe signal $\overline{CAS}$ and data transfer control signal $\overline{DT/OE}$ are returned to the high level, the dual-port memory ends the readout data transfer cycle Ct-2.

As the storage data serial output operation in the second serial output mode proceeds and when the final column address n is reached, the output signal als from the final bit in the pointer PNT is raised to the high level. In response to this, the timing signal $\phi ps$ is temporarily raised to the high level, and an output signal of the logic "1" is set to the corresponding bit in the pointer PNT in accordance with the select signal held in the address latch AL. Further, the internal control signal dreb is changed to the low level, and the internal control signal drea is raised to the high level instead after a predetermined delay time has elapsed thereafter, so that the bits in the data register DRA1 are respectively connected to the corresponding switching MOSFETs in the data selector DSL1. In consequence, among the readout data held in the data register DRA1, the readout data corresponding to the top column address c3 is input to the data buffer in the serial input- /output circuit SIO through the serial input/output complementary common data line $\overline{CDS1}$. Further, the transfer enable signal QSF is raised to the high level in synchronism with the trailing edge of the timing signal $\phi$ps to inform the external unit that the dual-port memory is ready to accept a subsequent readout data transfer cycle.

In this dual-port memory, thereafter, the timing signal $\phi$c is formed on the basis of the serial clock signal SC supplied continuously, and the shift signal in the pointer PNT is shifted in synchronism with every trailing edge of this timing signal $\phi$c, while the bits of readout data (r3·r3) to (r3·n) are sequentially delivered from the serial input/output terminal SIO1 in synchronism with every leading edge of the timing signal $\phi$c.

Thereafter, a similar serial output operation is repeatedly executed in the dual-port memory to form, for example, a series of image data for a CRT display, are thereby formed. As will be understood from the foregoing description, a readout data transfer cycle for designating a serial output mode is accepted when either one or both of the data registers DRA1 and DRB1 are empty. The transfer enable signal QSF is changed to the low level at the point of time when a readout data transfer cycle is accepted, and the signal QSF is raised to the high level at the point of time when the previous serial output operation is completed, that is, when the final column address n is reached. Accordingly, the transfer enable signal QSF can be utilized as a synchronizing signal for informing an external unit, such as a processing unit, of the word line switching timing in the serial output operation.

On the other hand, in the case of the serial input mode of the dual-port memory, a write data serial input operation is first conducted through one data register, and a serial input operation for a next serial input mode is subsequently executed through the other data register. While this serial input operation is being executed, a write data transfer cycle for the previous serial input mode is accepted, and the bits of write data held in the first data register are simultaneously input to a plurality of memory cells, respectively, which are coupled to a selected word line. In this write data transfer cycle, the top column address for the serial input mode after the next is input at the same time, and a high-level select signal is held at the bit in the address latch AL which corresponds to said top column address.

It is also possible in the dual-port memory of this embodiment to repeat the above-described serial output and input modes in a desired sequence. For this purpose, the timing control circuit TC in this dual-port memory is provided with two control flip-flops (not shown) in correspondence with the two sets of data registers, so that the above-described internal control signals drea, dreb and the data transfer timing signals $\phi$tra, $\phi$trb are switched from one to the other by shifting these control flip-flops from one to the other at the point of time when the readout data transfer cycle or the write data transfer cycle is started.

As has been described above, the dual-port memory in accordance with this embodiment is provided with the two sets of data registers DRA1 to DRA4 and DRB1 to DRB4 in correspondence with the memory arrays. These data registers are alternately used for serial input/output modes in accordance with a predetermined control procedure. More specifically, while a serial input/output operation of readout data or write data is being conducted through one data register, a parallel transfer cycle for readout data or write data can be executed through the other data register. Accordingly, the readout data transfer cycle or the write data transfer cycle for designating a serial input/output mode may be executed at a desired timing within a relatively long period of time during which the serial input/output operation in the previous serial input/output mode is conducted. Therefore, there is no strict temporal restriction on an external unit such as a processing unit which is provided outside the dual-port memory, and it is unnecessary to manage the column addresses in the dual-port memory. Accordingly, it is possible to increase the data transfer rate of the system relatively easily as well as simplify the arrangement of the system and lower the production cost thereof.

As will be obvious from the foregoing description of the embodiment, the following advantages are obtained when the present invention is applied to semiconductor memories such as a dual-port memory or the like:

(1) Provision of two sets of data registers for a dual-port memory enables parallel transfer of storage data between one data register and a plurality of memory cells coupled to a selected word line while a serial input/output operation for storage data is being conducted through the other data register.

(2) Provision of a transfer enable signal representative of the fact that at least one of the two sets of data registers is empty and the dual-port memory is therefore ready to accept a further serial input/output made enables indication of the operating state of the dual-port memory with respect to an external unit such as a processing unit which is provided outside the dual-port memory. In addition, by shifting this transfer enable signal at the final column address, this signal can be used as a synchronizing signal for obtaining synchronism between the dual-port memory and the external processing unit or the like.

(3) Since the dual-port memory is adapted to accept a data transfer cycle in accordance with a predetermined control signal (initial mode signal $\overline{DSF}$) irrespective of the state of the transfer enable signal in order to initialize the internal operation thereof, it is possible to initialize and normalize the operation of the dual-port memory immediately after the power supply has been turned on or after the supply of the serial clock signal has been cut off.

(4) Since the final column address in the serial input/output mode is defined by the final column address of the complementary data lines and the output signal from the final bit in the pointer is employed as a final column address detecting signal in a serial input/output operation, it is possible to omit the column address counter circuit or the like from the dual-port memory and simplify the arrangement thereof.

(5) By virtue of the advantages (1) to (4), a processing unit or the like which is provided outside the dual-port memory is able to make the dual-port memory execute a data transfer cycle for a subsequent serial input/output mode at a desired timing within a period of time during which the previous serial input/output operation is conducted. Accordingly, it is possible to increase the data transfer rate of the system and improve the processing capacity thereof.

(6) By virtue of the advantages (1) to (4), it becomes unnecessary to provide a counter circuit for counting, for example, column addresses, outside the dual-port memory, and it is therefore possible to simplify the arrangement of a processing unit or the like which is provided outside the dual-port memory and lower the production cost thereof.

Although the invention accomplished by the present inventors has been described specifically by way of the embodiment, it should be noted here that the present invention is not necessarily limitative to the described embodiment and various changes and modifications may, of course, be imparted thereto without departing from the gist of the invention. For example, although in the embodiment shown in FIG. 1 a data selector which is to be used is selected by selectively connecting the data register DRA1 or DRB1 to the data selector DSL1, data selectors may be provided respectively for the data registers DRA1 and DRB1 and selectively activated. In such a case, the arrangement may be such that two sets of complementary common data lines for serial input/output operations are provided in correspondence with the respective data selectors and storage data is selectively transmitted from the serial input/output circuit SIO. The flip-flops which constitute data registers DRA1 and DRB1 may be replaced with dynamic type latches. The dual-port memory shown in FIG. 2 may consist of one or eight or more sets of memory arrays, and the random access port may be omitted. In addition, the column select circuit which consists of the pointer PNT, address latch AL and column address decoder SCD for the serial access port may be composed of, for example, a binary counter circuit for counting column addresses and an address decoder for decoding them. Further, the arrangement may be such that a similar address counter is also provided in the row select circuit to enable the word lines to be sequentially designated within the dual-port memory in an autonomous manner.

The following is a description of another embodiment of a dual-port RAM to which the present invention is applicable.

The outline of this embodiment will briefly be explained below.

Namely, in a shared sense type dynamic RAM wherein a shared sense amplifier selectively receives and senses pieces of storage information output from a pair of memory arrays, a serial input/output circuit which is used in common to the memory arrays is disposed in correspondence with the data lines in either one of the memory arrays.

By virtue of the above-described arrangement, two sets of memory arrays and shared sense amplifiers can be disposed in bisymmetry with each other with respect to a single serial input/output circuit, and it is therefore possible to realize high integration of a RAM.

Figure 7:
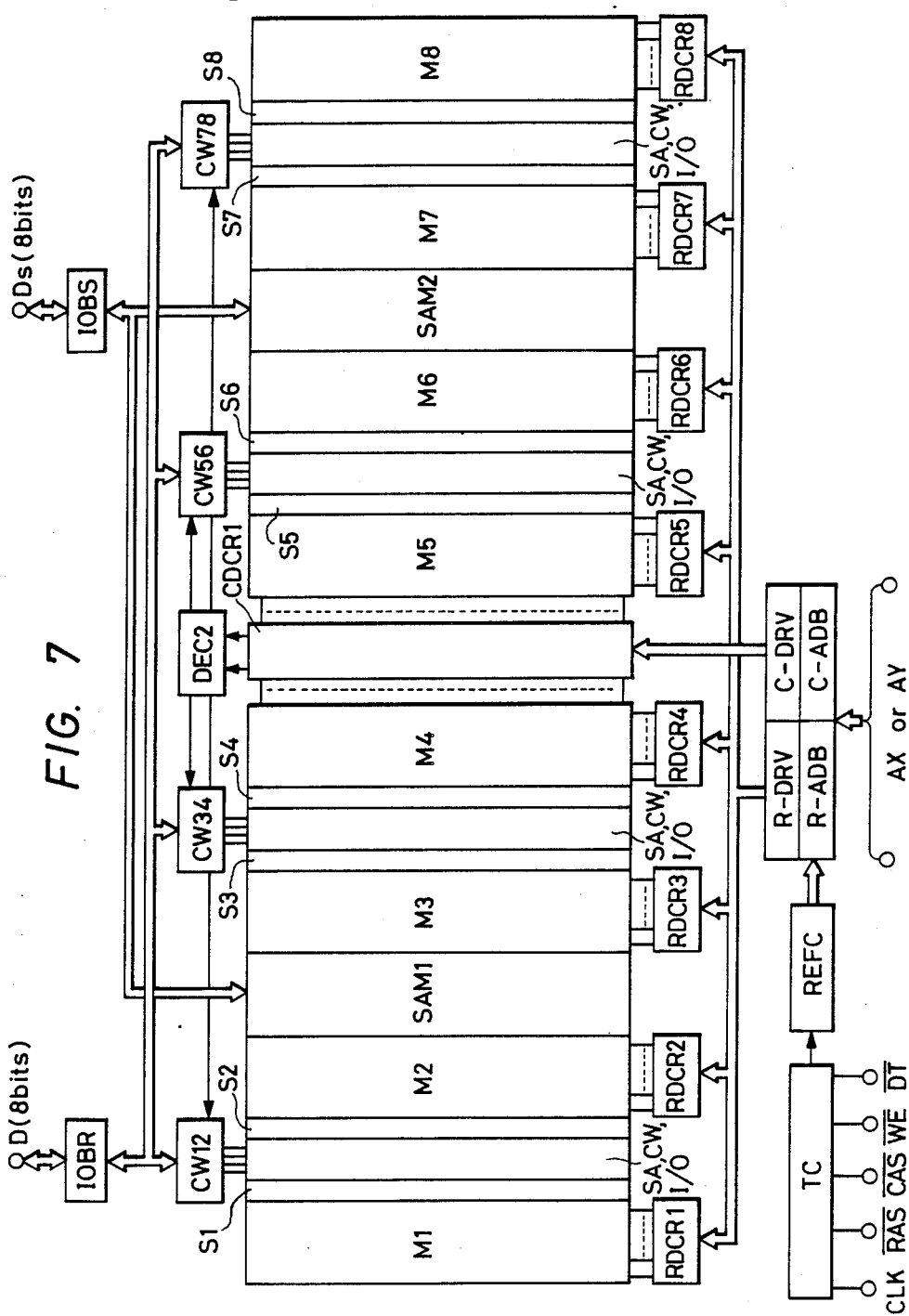
FIG. 7 is a block diagram showing another embodiment of a dual-port memory to which the present invention is applicable.

FIG. 7 is a block diagram showing the above-described embodiment. Essential circuit blocks shown in FIG. 7, such as memory arrays, sense amplifiers, column decoder, etc, are drawn in such a manner that the layout of these circuit blocks are substantially coincident with the actual geometric arrangement on a semiconductor chip, and they are formed on a single semiconductor substrate such as single crystal silicon by a known semiconductor integrated circuit technique, although not necessarily limitative thereto.

This embodiment is directed to a dynamic type RAM which adopts the shared sense system and which is additionally provided with a serial input/output function. The respective operations of various circuits which constitute in combination the RAM are controlled by various timing signals which are generated from a timing control circuit TC as will become clear from the following description. In order to prevent complication of the illustration, signal lines which are to be provided between the timing control circuit TC and the various circuits are not shown in FIG. 7.

The dynamic RAM in accordance with this embodiment has eight memory arrays M1 to M8, although not necessarily limitative thereto. Each of the memory arrays M1 to M8 is arranged according to the folded bit line (data line) system. Therefore, each of the memory arrays M1 to M8 has a plurality of data lines each consisting of a pair of lines, i.e., a plurality of complementary data lines, a plurality of dynamic type memory cells each having its data input/output terminal coupled to the corresponding data line, and a plurality of word lines to which are respectively coupled the select terminals of the memory cells. Although not shown in FIG. 7, the data lines extend horizontally as viewed in the figure, while the word lines extend vertically.

The memory arrays M1, M2; M3, M4; M5, M6; and M7, M8 are paired with each other. According to this embodiment, the respective data lines of each pair of memory arrays are formed so as to have data line capacities which are substantially equal to each other. For this purpose, the paired memory arrays M1 and M2 to M7 and M8 have the same arrangement as each other, that is, the same numbers of data lines, memory cells and word lines.

A sense amplifier (shared sense amplifier) SA is provided between the pair of memory arrays M1 and M2, the sense amplifier SA being selectively used by both of them. Column switches CW for random input/output operations and input/output lines I/O, which are selectively used by the two memory arrays M1 and M2 are disposed in the semiconductor region in which the sense amplifier SA is disposed. A sense amplifier SA, column switches CW and input/output lines I/O, which respectively have the same arrangements as those of the above-described ones, are also disposed between each of the other pairs of memory arrays M3, M4; M5, M6; and M7, M8.

A switching circuit S1 is provided between the memory array M1 and the corresponding sense amplifier SA for selectively coupling them to each other. Similarly, a switching circuit S2 is provided between the memory array M2 and the sense amplifier SA for selectively coupling them to each other. Switching circuits S3, S4; S5, S6; and S7, S8 which are similar to those described above are provided respectively between the other pairs of memory arrays M3, M4; M5, M6; and M7, M8 on the one hand and the corresponding sense amplifiers SA on the other.

In principle, when the sense amplifiers SA are in an operative state, the pairs of switching circuits S1 and S2 to S7 and S8 are ON/OFF controlled in a complementary manner by row timing signals as described later. In principle, two switching circuits S1 and S2 which correspond to one sense amplifier SA are controlled in such a manner that either one of the two is turned off at the start of the access operation of the memory. In consequence, one of the pair of memory arrays M1 and M2 is cut off from the sense amplifier SA, while the other is left coupled thereto. In other words, the pairs of data lines in one memory array are cut off from the sense amplifier SA, while the paris of data lines in the other memory array are left coupled thereto. The same is the case with the relationship between the sense amplifiers SA and the switching circuits S3 and S4 to S7 and S8 which correspond to the other memory arrays M3 and M4 to M7 and M8.

The operation of each of the sense amplifiers SA is controlled by the row timing signal described below.

It may be understood that each sense amplifier SA which serves as one circuit block shown in FIG. 7 includes dummy cells, an active restore circuit and the like such as those described below. Further, it may be understood that each of the memory arrays M1 to M8 is provided with a precharge circuit, although not necessarily limitative thereto.

The illustrated RAM has an address select circuit for selecting a desired one of a plurality of memory cells in each memory array and a desired one of a plurality of dummy cells in each memory array. The address select circuit is composed of a row address buffer R-ADB, a column address buffer C-ADB, a row address output circuit R-DRV, a column address output circuit C-DRV, row address decoders RDCR1 to RDCR8, column address decoders CDCR1, DEC2, and column switch circuits CW provided in correspondence with the above-described sense amplifiers SA.

The operation of each of the circuits which constitute the address select circuit is controlled by a timing signal which is generated from the timing control circuit TC.

A plurality of external terminals of the RAM, to which are coupled the respective input terminals of the row and column address buffers R, C-ADB, are supplied with external row and column address signals AX and AY each consisting of a plurality of bits in a time division manner in accordance with the address multiplex system.

The row address buffer R-ADB is supplied with the external row address signal AX in response to a timing signal for controlling the input of the address signal AX which timing signal is generated in synchronism with the generation of a row address strobe signal $\overline{RAS}$. As a result, internal complementary address signals which are to be supplied to the row address decoders RDCR1 to RDCR8 are output from the address buffer R-ADB through the address output circuit R-DRV. The column address buffer C-ADB is supplied with the external column address signal AY in response to a similar timing signal which is generated from the timing control circuit TC in synchronism with the generation of a column address strobe signal $\overline{CAS}$, and outputs internal complementary address signals which are to be supplied to the column address decoders CDCR1 and DEC2 through the address output circuit C-DRV.

The row address decoders RDCR1 to RDCR8 are disposed at the lower side of the memory arrays M1 to M8 as viewed in FIG. 7, and the respective output terminals of the row address decoders are coupled to he word lines in the corresponding memory arrays. The operation of each of the row address decoders RDCR1 to RDCR8 is controlled by a word line select timing signal which is generated from the timing control circuit TC, and each row address decoder out puts a word line select signal and a dummy word line select signal in synchronism with the timing signal Accordingly, the word lines in the memory arrays M1 to M8 are selected when they are supplied with the word line select signals formed by the row address decoders RDCR1 to RDCR8, respectively In this case, the pairs of adjacent row address decoders RDCR1 and RDCR2 to RDCR7 and RDCR8 are so arranged that, when one word line in the odd-number memory array M1, M3, M5 or M7 is selected, all the word lines in the even-number memory array M2, M4, M6 or M8, which is paired with said odd-number memory array, are brought into a non-select state, whereas, when one word line in the even-number memory array M2, M4, M6 or M8 is selected, all the word lines in the odd-number memory array M1, M3, M5 or M7 are brought into a non-select state.

The operation of the column address decoder CDCR1 is controlled by a data line select timing signal or column select timing signal which is output from the timing control circuit TC so that the column address decoder CDCR1 outputs a data line select signal or column select signal in synchronism with the timing signal. The column address decoder CDCR1 is disposed in the center of the memory mat as illustrated. Accordingly, the output lines or data line select lines of the column address decoder CDCR1 extend over the left-hand memory arrays M4, M3, M2 and the right-hand memory arrays M5, M6, M7 and are coupled to the column switch circuits CE. It should be noted that the output lines of the column address decoder CDCR1 are also coupled to a pointer which is adapted to designate the top address for a serial input/output operation carried out in serial input/output circuits SAM1 and SAM2 such as those described below. The column address decoder CDCR1 consists of a plurality of unit circuits which give their outputs to the corresponding data line select lines, respectively.

The column switch circuits CW which are disposed together with the shared sense amplifiers SA are provided respectively between the input/output lines I/O for random input/output operations and the input/output terminals of the sense amplifiers SA, which are provided in correspondence with the pairs of memory arrays M1 and M2 to M7 and M8. The column switch circuits CW are mutually supplied with the data line select signal formed by the column address decoder CDCR1. More specifically, each of the column switch circuits CW is supplied with the select signal formed by the column address decoder CDCR1 and selectively couples the input/output terminals of the corresponding sense amplifier SA and the input/output lines I/O (not shown) which extend vertically as viewed in FIG. 7.

When the unit circuits which constitute the column address decoder CDCR1 are formed on a semiconductor substrate according to a semiconductor integrated circuit technique, they are arranged with a relatively large pitch. In accordance with this embodiment, each column switch circuit CW is arranged such as to simultaneously couple four pairs of adjacent complementary data lines to four pairs of complementary common data lines in response to one data line select signal in consideration of a practicalbe pitch for the unit circuits constituting the column address decoder circuit CDCR1, although not necessarily limitative thereto. Thus, the pitch of the unit circuits of the column address decoder CDCR1 is made coincident with the pitch of a total of eight data lines. In this arrangement, a total of 16 bit signals, i.e., 4 bit signals from the memory array M1 or M2, 4 bit signals from the memory arays M3 to M4, 4 bit signals from the memory arrays M5 or M6, and 4 bit signals from the memory array M7 or M8, are simultaneously selected by a column select circuit which consists of the column address decoder CDCR1 and the column switches CW1. In accordance with this embodiment, in order to select 8 bit signals from a total of 16 bit signals, second column switch circuits CW12, CW34, CW56 and CW78 are provided respectively between the four sets of input/output lines I/O corresponding to the pairs of memory arrays M1 and M2 to M7 and M8 and the input/output circuit IOBR for random input/output operations, although not necessarily limitative thereto. The operation of each of the second column switch circuits CW12 to CW78 is controlled by a select signal which is formed by the second column address decoder circuit DEC2. It should be noted that, when information consisting of 4 bits is to be input or output, it is only necessary to selectively activate the four column switch circuits CW12 to CW78. In such a case, it is possible to effect input/output operations in the nybble mode by imparting a simple change mainly to the second column address decoder circuit DEC2 and adding an address generator circuit.

In this embodiment, serial input/output circuits SAM1 and SAM2 are disposed respectively between the memory arrays M2 and M3 and between the memory arrays M6 and M7. Although not necessarily limitative, each of the serial input/output circuits SAM1 and SAM2 includes data storage circuits corresponding to the above-described pairs of data lines, a switching circuit for coupling the input/output terminals of the data storage circuits to the serial input/output lines, a shift register for forming a select operation of the switching circuit, and an address pointer which receives the decode output from the column decoder circuit CDCR1 and stores an initial value for the shift register.

It should be noted that the serial input/output circuit SAM1 is provided with a switching circuit (not shown) for selectively coupling the circuit SAM1 to the memory array M2 and a switching circuit (now shown) for selectively coupling the circuit SAM1 to the memory array M3. The serial input/output circuit SAM2 which is provided between the memory arrays M6 and M7 is also provided with switching circuits which are similar to those described above.

The above-described pair of switching circuits are ON/OFF controlled in a complementary manner during a data transfer operation between the serial input/output circuit SAM1 or SAM2 and the corresponding memory arrays. For example, when data transfer is to be effected between the serial input/output circuit SAM1 and the memory arrays M1 and M2 which are disposed on the left-hand side of the circuit SAM1, the switching circuit which corresponds thereto is turned on, while the switching circuit which corresponds to the right-side memory arays M3 and M4 is turned off. Conversely, when data transfer is to be effected between the serial input/output circuit SAM1 and the memory arays M3 and M4 which are disposed on the right-hand side of the circuit SAM1, the switching circuit which corresponds thereto is turned on, while the switching circuit which corresponds to the left-side memory arrays M1 and M2 is turned off. The same is the case with the data transfer which is effected between the other serial input/output circuit SAM2 and the memory arrays M5 and M6 or M7 and M8.

The input/output lines of the serial input/output circuits SAM1 and SAM2 are connected to a serial input/output circuit IOBS. This serial input/output circuit IOBS exchanges data serially between the same and an external terminal Ds.

The timing control circuit TC for controlling operations of reading and writing information receives a row address strobe signal $\overline{RAS}$, a column address strobe signal $\overline{CAS}$, a write enable signal $\overline{WE}$, a data transfer signal $\overline{DT}$ for serial input/output operations and a clock signal CLK, which are supplied from external terminals, and the circuit TC generates various timing signals for random or serial input/output operations.

It should be noted that a refresh control circuit REFC generates an address signal for a refresh operation with the row address strobe signal $\overline{RAS}$ employed as a clock signal when the row address strobe signal $\overline{RAS}$ is changed to the low level after the column address strobe signal $\overline{CAS}$ has been changed to the low level (i.e., CAS-before-RAS refresh operation). The above-described refreshing address signal is input through the row address buffer R-ADB. Therefore, the row address buffer R-ADB has a multiplexer function which enables it to be switched in accordance with a control signal formed during the above-described refresh operation.

Figure 9:
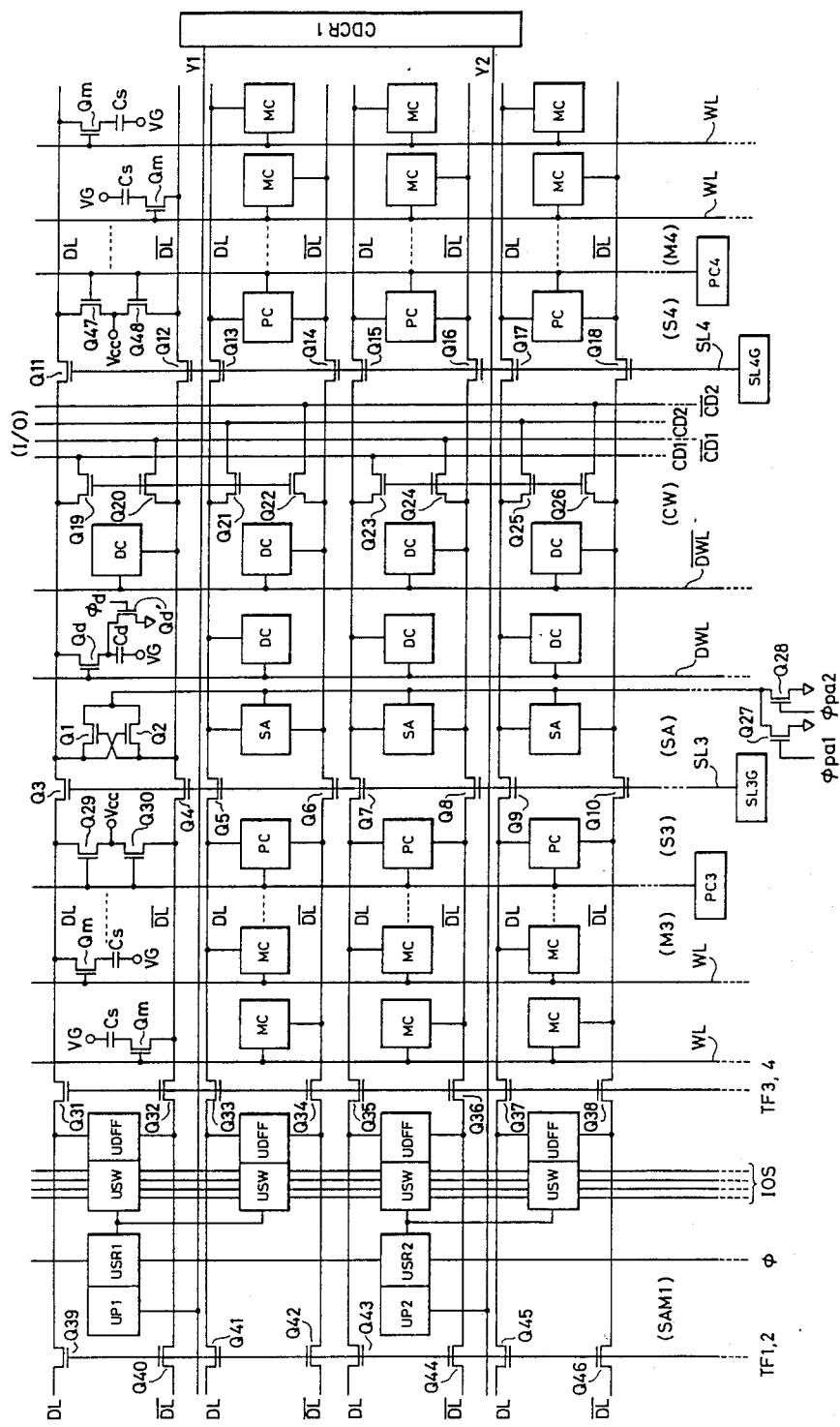
FIG. 9 is a circuit diagram showing a practical example of essential circuits in the arrangement shown in FIG. 7.

FIG. 9 is a circuit diagram showing one practical example of an essential part of the dynamic RAM shown in FIG. 7. FIG. 9 exemplarily shows the memory arrays M3, M4 and the serial input/output circuit SAM1.

The memory array M3 consists of a plurality of complementary data lines DL, $\overline{DL}$, a plurality of word lines WL and a plurality of dynamic type memory cells. The memory array M3 is arranged according to the folded bit line (digit line or data line) system. Accordingly, each memory cell is disposed at either of the two intersections defined between one pair of complementary data lines and one word line. The memory array M4 has the same arrangement as that of the memory array M3.

Each memory cell MC for storing and reading out 1 bit of information consists of an information storing capacitor Cs and an address selecting MOSFET Qm as illustrated. Information of the logic "1" or "0" is stored in the form of presence or absence of an electric charge in the capacitor Cs. Information is read out by turning on the MOSFET Qm so as to couple the capacitor Cs to one of the complementary data lines and sensing a change in the potential of the data line which occurs in accordance with the amount of electric charge accumulated in the capacitor Cs.

In each of the memory arrays M3 and M4, each memory cell MC is formed so as to have a relatively small size as described above, and a multiplicity of memory cells are coupled to each pair of complementary data lines disposed parallel to each other. Therefore, the ratio of the capacitor Cs to the floating capacitance Co (not shown) of the data line DL has an exceedingly small value. Accordingly, the change in potential of the data line in accordance with the amount of electric charge accumulated in the capacitor Cs results in an exceedingly minute signal. However, in this embodiment the length of one data line and the number of memory cells which are coupled to one data line are halved by dividing the data line as described above, and therefore the floating capacitance Co (not shown) of the data line is decreased. As a result, the level of a readout signal from a memory cell which appears on the data line can be made relatively high.

Dummay cells DC are provided so as to function as a circuit for forming a reference potential for the sensing operation of the sense amplifier SA for detecting such a minute signal. Each dummy cell DC is composed of a switching MOSFET Qd which is produced under the same manufacturing conditions and with the same design constant as those for the memory cells MC and a capacitor Cd having a capacitance which is about a half that of the capacitor Cs. The capacitor Cd of the dummy cell DC is stored with the ground potential of the circuit by the operation of a reset MOSFET Qd' when the memory is in a stand-by state.

The sense amplifier SA consists of a plurality of unit circuits each composed of amplifying MOSFETs Q1 and Q2 arranged in the form of a latch. The sense amplifier SA amplifies a minute difference between potential changes given to each pair of complementary data lines in addressing during a sense period which is determined by timing signals (sense amplifier control signals) $\phi pa1$ and $\phi pa2$ (the operation of the sense amplifier SA will be described later in more detail).

One unit circuit (Q1 and Q2) of the sense amplifier SA has its input/output terminals coupled to a pair of parallel complementary data lines DL and $\overline{DL}$, respectively, on the side of the memory array M3 through switching MOSFETs Q3 and Q4 which constitute the above-described switching circuit S3, the input/output terminals of the unit circuit being further coupled to a pair of parallel complementary data lines DL and $\overline{DL}$, respectively, on the side of the memory array M4 through switching MOSFETs Q11 and Q12 which constitute the above-described switching circuit S4. When the memory array M3 is in a select state, the switching MOSFETs Q3 and Q4 are maintained in an ON state in accordance with a timing signal SL3. When the memory array M4 is in a select state, the switching MOSFETs Q11 and Q12 are maintained in an ON state in accordance with a timing signal SL4. These timing signals SL3 and SL4 are formed by timing generator circuits SL3G and SL4G, respectively.

The number of memory cells which are coupled to each of the right and left halves of the divided complementary data lines is set so as to be equal to each other with a view to increasing the degree of accuracy in detection. One dummy cell DC is coupled to each of the pair of input/output nodes of each unit circuit of the sense amplifier SA.

When, in the above-described addressing, a memory cell MC which is coupled to one of a pair of complementary data lines in the memory array M3 or M4 is selected, one of a pair of dummy word lines DWL and $\overline{DWL}$ is selected so as to select the dummy cell DC which is coupled to the one of a pair of input/output nodes of the corresponding unit circuit of the sense amplifier SA which node is coupled to said data line through a switching MOSFET.

The sense amplifier SA has each unit circuit thereof composed of a pair of cross-coupled MOSFETs Q1 and Q2 as described above and differentially amplifies a minute signal appearing between a pair of complementary data lines by the positive feedback action of these MOSFETs Q1 and Q2. This positive feedback operation is started when a MOSFET Q27 is turned on in response to a timing signal $\phi pa$. The MOSFET Q27 is arranged so as to show a relatively small conductance when it is turned conductive. When the operation of the sense amplifier SA1 is started in response to the above-described timing signal $\phi pa1$, a potential difference which has previously been given between a pair of complementary data lines by addressing is amplified. More specifically, the higher data line potential is lowered at a relatively low speed, while the lower data line potential is lowered at a relatively high speed. When said voltage difference is increased to a certain extent, a timing signal $\phi pa2$ is generated, and a MOSFET Q28 is turned on in response to the generation of the timing signal $\phi pa2$. The MOSFET Q28 is arranged so as to have a relatively large conductance when it is turned conductive. As the conduction of the MOSFET Q28 is started, the above-described lower data line potential is lowered even more quickly. Thus, the sense amplifier SA1 is arranged to operate in two stages and it is thereby possible to prevent the above-described higher potential from undesirably falling by a large margin. When the lower potential lowers below the threshold voltage of the cross-coupled MOSFETs, the positive feedback operation terminates. Thus, the higher potential remains at a potential which is lower than the power supply voltage Vcc and which is higher than said threshold voltage, while the lower potential eventually reaches the ground potential (0V).

It should be noted that an unignorable coupling capacitance is undesirably formed between each data line and each word line in each memory array. Therefore, when the level of one word line is changed, an undesirable potential change which is substantially regarded as a noise is applied to each data line. However, in the folded bit line type memory array each word line WL intersects both of a pair of complementary data lines. Therefore, the noise which is applied to the complementary data lines in accordance with a change in level of a word line WL may be regarded as a common mode noise. The differential type sense amplifier SA is substantially insensitive to such a common mode noise.

The storage information in a memory cell MC which has once almost been destroyed during the above-described addressing is restored by receiving straightly a high- or low-level potential obtained by the operation of the sense amplifier SA. However, if the high level becomes lower than the power supply voltage Vcc by a predetermined value, this state of the signal may erroneously be read as the logic "0" after repetition of read and rewrite operations. In order to prevent such malfunction, an active restore circuit is provided although it is not illustrated because this circuit is not directly related to the present invention. The active restore circuit acts so as to selectively boost the high-level signal alone to a potential equal to the power supply voltage Vcc without any effect on the low-level signal.

Although not necessarily limitative, the precharge circuit is provided for each of the memory arrays M3 and M4. As will be clear from the illustration of a typical precharge circuit which is exemplarily shown in the memory array M3, a unit circuit of the precharge circuit consists of precharge MOSFETs Q29 and Q30 which are connected respectively between the complementary data lines DL, $\overline{DL}$ and the power supply voltage Vcc. Similar unit circuits PC consisting of precharge MOSFETs are also provided for the other complementary data line pairs, respectively. These precharge circuits are controlled by a precharge signal which is formed by a timing generator circuit PC3. Similarly, the memory array M4 is provided with precharge MOSFETs which are defined by MOSFETs Q47 and Q48 such as those exemplarily illustrated. Similar unit circuits PC consisting of precharge MOSFETs are also provided for the other complementary data line pairs in the memory array M4. These precharge circuits are controlled by a precharge signal which is formed by a timing generator circuit PC4.

The timing generator circuits PC3 and PC4 operate in such a manner that the precharge signals formed therein are raised to a high level during the nonaccess period of the RAM, that is, when the signal $\overline{RAS}$ is at the high level. In consequence, the complementary data lines are precharged to a high level which is close to the level of the power supply voltage Vcc. It should be noted that each unit circuit in the precharge circuits may include an equalizing MOSFET which shorts a pair of complementary data lines to each other in response to the precharge signal.

Although not necessarily limitative, the input/output nodes of one unit circuit constituting the sense amplifier SA are respectively connected to a pair of common complementary data lines CD1 and $\overline{CD1}$ through MOSFETs Q19 and Q20 which constitute a column switch circuit. The input/output nodes of another unit circuit which is adjacent to said unit circuit are connected to a pair of common complementary data lines CD2 and $\overline{CD2}$ through MOSFETs Q21 and Q22, respectively. The input/output nodes of the other unit circuits are also connected to the common complementary data line pairs CD1, $\overline{CD1}$ and CD2, $\overline{CD2}$ through similar MOSFETs Q23, Q24 and Q25, Q26, respectively. These common complementary data lines CD1, $\overline{CD1}$ and CD2, $\overline{CD2}$ constitute the above-described input/output lines I/O. In the illustrated embodiment, the arrangement is such that 2 bits of information are read out from or stored in the pair of memory arrays M3 and M4, respectively, in one memory access cycle, with a view to simplifying the illustration. However, to access information consisting of 4 bits as described above, four pairs of common complementary data lines are provided for four pairs of complementary data lines.

By providing two sets of common complementary data lines CD1, $\overline{CD1}$ and CD2, $\overline{CD2}$ in this way, the gates of the column switch MOSFETs Q19 to Q22 are made common to each other. The common gate is supplied with a data line select signal Y1 formed by a unit circuit which constitutes a column address decoder. Thus, it is possible to lay out unit circuits constituting the column address decoder at the same pitch as that of the groups of data lines each consisting of four data lines, and this enables elimination of a wastefully occupied space on the semiconductor substrate.

Although not shown in FIG. 9, memory arrays M1, M2; M5, M6; and M7, M8, which are similar to the above-described memory arrays M3 and M4, are further provided in the RAM in accordance with this embodiment to define so-called 8-mat arrangement as shown in FIG. 7. The above-described column select signals Y1 and the like are also mutually supplied to the gates of column select MOSFETs in the other memory arrays (not shown). Accordingly, the column select lines extend toward these memory arrays.

In this embodiment, the following serial input/output circuit SAM1 is disposed at the left-hand end of the complementary data lines DL, $\overline{DL}$ in the memory array M3. More specifically, signals from pairs of complementary data lines DL, $\overline{DL}$ in the memory array M3 are transferred to corresponding unit data latch circuits UDEF through corresponding switching MOSFETs Q31 to Q38 which are provided at the left-hand end of the memory array M3. The switching MOSFETs Q31 to Q38 are turned on by a transfer timing signal TF3, 4 to transfer signals from the corresponding complementary data lines in the memory array M3 to the corresponding latch circuits UDFF. The latch circuits UDFF correspond to the data registers DRA1 and DRB1 shown in FIG. 2. These latch circuits UDFF are formed using static type flip-flop circuits which are defined by CMOS (Complementary MOS) circuits in order to enable a serial output operation in a long cycle. It should be noted that in this embodiment the latch circuits UDFF are not necessarily defined by a plurality of data registers. However, provision of a plurality of data registers makes it possible to obtain advantageous effects similar to those of the embodiment shown in FIG. 2, such as realization of high-speed serial input/output operations.

In order to serially output signals held in the data latch circuits UDFF or supply the data latch circuits UDFF with write signals which are serially supplied from the outside, the input/output terminals of the data latch circuits UDFF are coupled to the serial input/output lines IOS through corresponding unit switching circuits USW each consisting of a pair of switching MOSFETs similar to the above-described column switch MOSFETs Q19, Q20, etc. The switching circuits USW correspond in combination to the data selector DSL1 shown in FIG. 2. The serial input/output lines IOS correspond in combination to the complementary common data line $\overline{CDS1}$ for serial input/output operations which is shown in FIG. 2. The switching circuits USW are ON/OFF controlled to realize the above-described 2-bit random access operation in such a manner that two unit circuits which correspond to two sets of complementary data lines are mutually supplied with an alternative select signal which is formed in the corresponding one of the unit circuits USR1, USR2 which constitute in combination a shift register. The circuits USR1, USR2 which constitute a shift register correspond in combination to the pointer PNT shown in FIG. 2. In this embodiment, in order to enable a serial output operation to be started from a desired bit (address), the output signal from the final stage of the shift register is fed back to the unit circuit which defines the first stage, although such an arrangement is not illustrated. Thus, the shift register is arranged to perform a ring-shaped shift operation. The unit circuits of the shift register are supplied with their initial values (the logic "1" or the logic "0") from the corresponding unit circuits UP1, UP2, etc. which constitute an address pointer which receives decoded signals of the column address signals which are supplied in the serial transfer mode (described later), although not necessarily limitative thereto. In other words, in the shift register, a select signal of the logic "1" is set through the address pointer into a bit which corresponds to the complementary data lines in the RAM which are designated by the above-described column address signals. The circuits UP1, UP2, etc. which constitute the address pointer correspond in combination the address latch AL shown in FIG. 2. In the above-described arrangement in which the address pointer is provided, when bits of storage data are serially and repeatedly read out from the same Y-addresses, it is unnecessary to set initial values for the shift register every serial output cycle, and it is therefore possible to omit the setting of initial values.

The shift register shifts the above-described select signal (logic "1") in response to a shift clock signal $\phi$ which is formed by the timing control circuit TC on the basis of a cock signal supplied from the external terminal CLK. Thus, it is possible to serially read out storage information from the memory cells coupled to one word line or serially supply write information to the memory cells corresponding to said word line at maximum.

Pairs of input/output terminals of the data latch circuits UDFF are also coupled to the complementary data lines DL, $\overline{DL}$ in the memory array M2 (not shown) through switching MOSFETs Q39 to Q46. The gates of these switching MOSFETs Q39 to Q46 are mutually supplied with a transfer timign signal TF1, 2.

Since this embodiment is arranged such that transfer of data is effected between the serial input/output circuit SAM1 (SAM2) and two pairs of memory arrays M1, M2 and M3, M4 (M5, M6 and M7, M8), it is possible to effect serial input/output operations with a reduced circuit size. Thus, it is possible to realize a multifunctional RAM while reducing the chip size.

To realize transfer of data between one serial input/output circuit SAM1 (SAM2) and two paris of memory arrays M1, M2 and M3, M4 (M5, M6 and M7, M8), for example, between the serial input/output circuit SAM1 (SAM2) and the memory arrays M1 and M4 (M5 and M8), the complementary data lines in the memory arrays M2 and M3 (M6 and M7) are utilized as signal lines. Accordingly, when the memory arrays M1 or M4 (M5 or M8) is to be accessed, the switching circuit S2 or S3 (S6 or S7) is temporarily turned off at the time of starting the operation of the sense amplifier SA as described above, but turned on again when a data transfer operation is to be executed. Thus, a signal path is formed between the memory array M1 or M4 (M5 or M8) and the serial input/output circuit SAM1 (SAM2).

Figure 10:
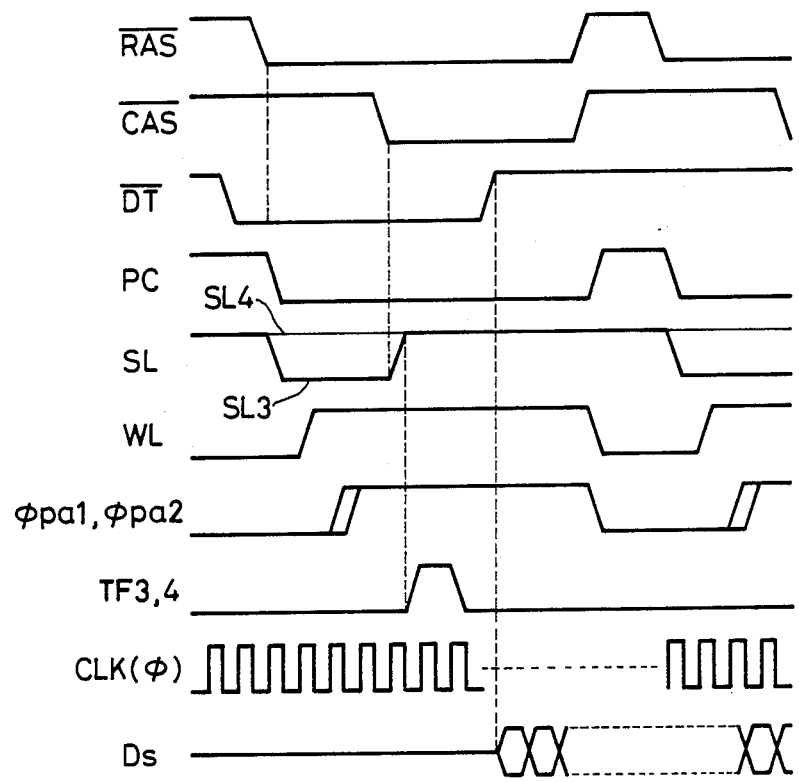
FIG. 10 is a timing chart showing one example of the operation of the embodiment shown in FIG. 7.

This operation will be described below in detail with reference to the timing chart shown in FIG. 10.

Prior to the change of the row address strobe signal $\overline{RAS}$ from the high level to the low level, the data transfer signal $\overline{DT}$ is changed to the low level. Detecting the fall of the signal $\overline{RAS}$, the timing control circuit TC acknowledges the data transfer mode. The precharge signal PC is changed from the high level to the low level in synchronism with the fall of the row address strobe signal $\overline{RAS}$. In consequence, the precharge MOSFETs are turned off, and the address signal AX (not shown) is taken in. Thus, the row select operation of the RAM, that is, the operation of selecting one word line, and the amplifying operation of the sense amplifier are effected, so that signals corresponding to the storage information in the selected memory cells appear on the complementary data lines in the RAM. In this case, if, for example, one word line WL in each of the even-number memory arrays, such as the memory arrays M2, M4, M6 and M8, is selected, the even-number switching circuits S2 to S8 are maintained in the ON state in accordance with the select operation carried out in the memory arrays M2 to M8, while the odd-number switching circuits S1 to S7 are switched over from the ON state to the OFF state. In FIG. 10 is exemplarily shown the control signals SL3 and SL4 corresponding to the switching circuits S3 and S4, respectively.

After the odd-number switching circuits S1 to S7 have been turned off, one word line WL in each of the even-number memory arrays M2 to M8 is brought into a select state.

In response to the selection of the word lines WL, minute signals corresponding to the storage information in the selected memory cells appear on the complementary data lines in each of the memory arrays M2 to M8. The minute readout signals are amplified by the amplifying operation of the sense amplifier SA which starts in response to the timing signals $\phi pa1$ and $\phi pa2$.

When the column address strobe signal $\overline{CAS}$ is changed to the low level, the address signal AY is taken in synchronism with the fall of the signal $\overline{CAS}$. In this operation mode, setting of initial values for the pointer is carried out in place of the column select operation. More specifically, the logic "1" is set in the one unit pointer UPi which is designated by the decoded output of the address signal AY, while the logic "1" is set in all the remianing unit pointers UP. The pieces of information held by these unit pointers UP are transferred to the shift register as they are, thus effecting initial setting with respect to the shift register.

For example, to serially read out storage information from the memory arrays M4 and M8, the control signals SL3 and SL7 corresponding to the switching circuits S3 and S7 that are required for data transfer among the odd-number switching circuits which are in the OFF state are raised to the high level again in synchronism with the fall of the signal $\overline{CAS}$, although not necessarily limitative thereto. Thus, the bits of storage information, which have been read out from the memory cells coupled to the selected word lines in the memory arrays M4 and M8 and amplified by the operation of the corresponding sense amplifiers, can be transferred to the corresponding data latch circuits in the serial input/output circuits SAM1 and SAM2 through the complementary data lines in the memory arrays M3 and M7 which are in the non-select state. In this case, in the serial input/output circuits SAM1 and SAM2 are formed transfer timing signals TF3, 4 (TF7, 8) corresponding to the switching MOSFETs which are disposed on the right-hand side of each of the circuits SAM1 and SAM2.

To serially read out storage information from the memory arrays M1 and M5, the control signals SL2 and SL6 (not shown) corresponding to the switching circuits S2 and S6 that are required for data transfer among the even-number switching circuits which are in the OFF state are raised to the high level again. Thus, the bits of storage information, which have been read out from the memory cells coupled to the selected word lines in the memory arrays M1 and M5 and amplified by the operation of the corresponding sense amplifiers, can be transferred to the corresponding data latch circuits in the serial input/output circuits SAM1 and SAM2 through the complementary data lines in the memory arrays M2 and M6 which are in the non-select state. In this case, in the serial input/output circuits SAM1 and SAM2 are formed transfer timing signals TF1, 2 (TF5, 6) corresponding to the switching MOSFETs which are disposed on the left-hand side of each of the circuits SAM1 and SAM2.

To effect data transfer between the serial input/output circuits SAM1, SAM2 and the memory arrays M2 or M3 and M6 or M7, respectively, which are adjacent to the circuits SAM1 and SAM2, these circuits SAM1 and SAM2 are connected directly to the memory arrays M2 or M3 and M6 or M7, respectively. Therefore, the switching circuits S1 or S4 and S5 or S8 corresponding to the memory arrays M1 or M4 and M5 or M8 which are in the non-select state at this time are maintained in the OFF state.

Thereafter, when the data transfer signal $\overline{DT}$ is changed from the low level to the high level, the supply of the shift clock signal $\phi$ to the shift register is started, and the above-described shift operation is executed Thus, the bits of information held in the data latch circuits FF corresponding to the bits which are sequentially designated by the column address signal AY are serially output from the external terminal Ds in synchronism with every fall of the clock signal $\phi$.

Thereafter, if the signals $\overline{RAS}$ and $\overline{CAS}$ are temporarily raised to the high level and then changed to the low level in parallel to the above-described serial output operation, an 8-bit (4-bit) random access write/read operation can be performed.

In the write operation, write information has previously been transferred to the data latch circuits by the serial input operation, and the write data is then transferred to a selected memory array by the above-described transfer operation, whereby it is possible to write information for one word line simultaneously.

Figure 8:
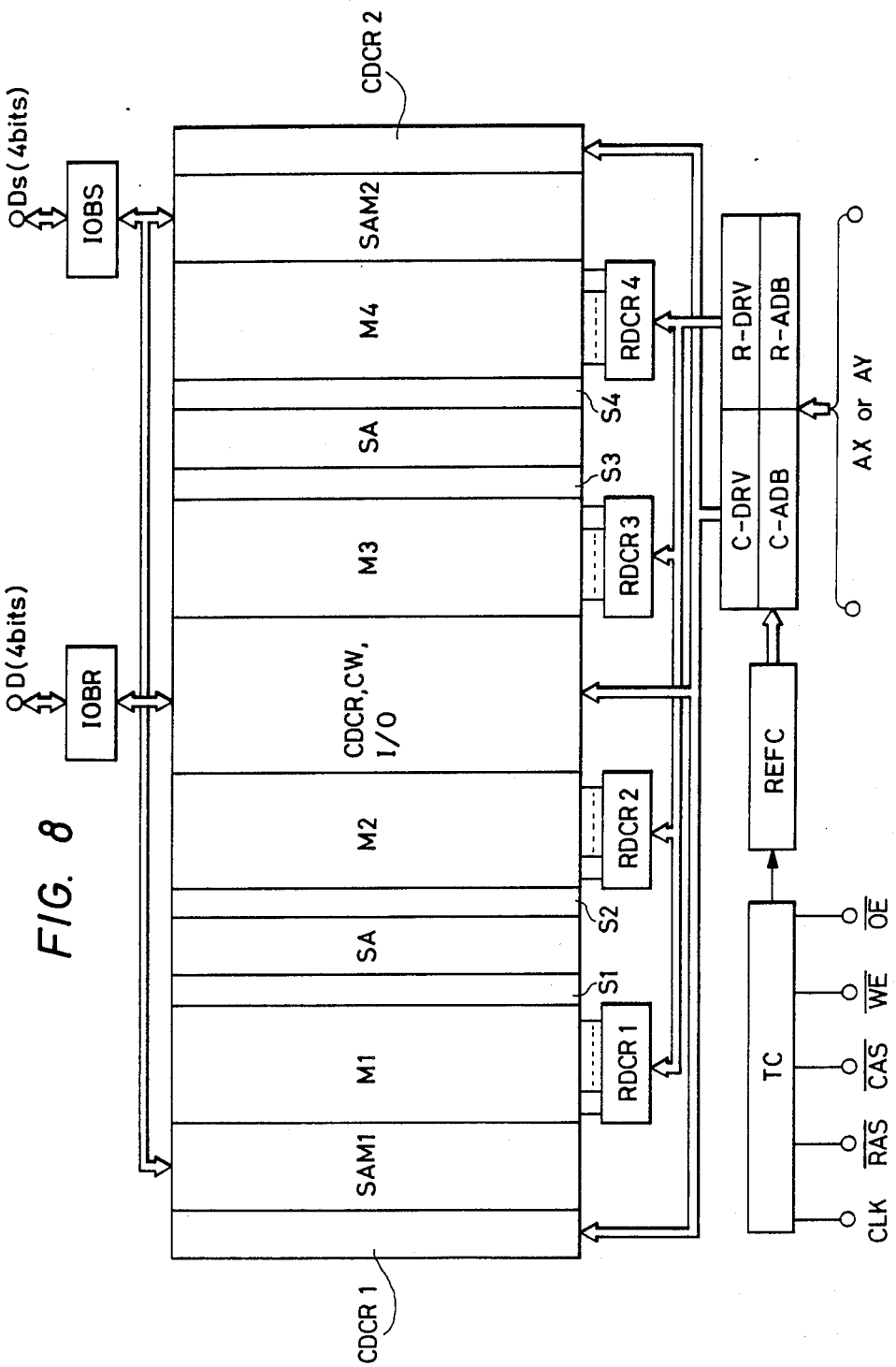
FIG. 8 is a block diagram of still another embodiment of a dual-port memory to which the present invention is applicable.

FIG. 8 is a block diagram showing still another embodiment of a dynamic RAM to which the present invention is applicable. Essential circuit blocks shown in FIG. 8, such as memory arrays, sense amplifiers and column decoders, are drawn in such a manner that the layout of these circuits are substantially coincident with the actual geometric arrangement thereof on a semiconductor chip in the same way as in the case of FIG. 7.

This embodiment is directed to a dynamic RAM which adopts the shared sense system and which is additionally provided with a serial input/output function, although not necessarily limitative thereto The operations of various circuits which constitute in combination the RAM are controlled by various timing signals, respectively, which are generated from a timing control circuit TC as will be clear from the following description. However, signal lines which are to be provided between the timing control circuit TC and the various circuits are not shown in FIG. 8 with a view to preventing complication of the illustration.

The dynamic RAM in accordance with this embodiment has four memory arrays M1 to M4, although not necessarily limitative thereto Each of the memory arrays M1 to M4 is arranged according to the folded bit line (data line) system. Accordingly, each of the memory arrays M1 to M4 has a plurality of pairs of data lines, i.e., a plurality of complementary data lines, a plurality of dynamic type memory cells having their data input/output terminals coupled to the corresponding data lines, respectively, and a plurality of word lines to which are coupled the select terminals of the dynamic type memory cells, respectively. The data lines (not shown) extend horizontally as viewed in FIG. 8, while the word lines extend vertically.

The memory arrays M1, M2 and M3, M4 are paired with each other, respectively. According to this embodiment, the data lines in each of the paired memory arrays have data line capacitances which are substantially equal to each other. For this purpose, the pair of memory arrays M1 and M2 (M3 and M4) have the same arrangement, that is, the same numbers of data lines, memory cells and word lines, although not necessarily limitative thereto.

Unlike the embodiment shown in FIG. 7, this embodiment is arranged such that the sense amplifier SA alone is disposed between the pair of memory arrays M1 and M2 and the column switches CW for random input/output operations and the input/output lines I/O, which are selectively used by the two memory arrays M1 and M2, are not disposed therebetween. A sense amplifier SA having the same arrangement as the above is disposed between the other pair of memory arrays M3 and M4.

Between the memory array M1 and the corresponding sense amplifier SA is provided a switching circuit S1 for selectively coupling them to each other. Similarly, a switching circuit S2 is provided between the memory array M2 and the above-described sense amplifier SA. Switching circuits S3 and S4 which are similar to those described above are provided respectively between the other pair of memory arrays M3, M4 and the corresponding sense amplifier SA.

In principle, the pairs of switching circuits S1, S2 and S3, S4 are ON/OFF controlled in a complementary manner by row timing signals (described above) when the operation of the corresponding sense amplifier SA is to be started. In principle, two switching circuits S1 and S2 which correspond to one sense amplifier SA are controlled in such a manner that, when a memory access cycle is to be started, one of the switching circuits S1 and S2 is turned off. Thus, one of the pair of memory arrays M1 and M2 is cut off from the sense amplifier SA, while the other sense amplifier SA is left coupled thereto. In other words, the pairs of data lines in one memory array are cut off from the sense amplifier SA, while the pairs of data lines in the other memory array are left coupled thereto. The same is the case with the relationship between the sense amplifier SA and the switching circuits S3, S4, which correspond to the other pair of memory arrays M3 and M4.

The illustrated RAM has an address select circuit for selecting a desired one of a plurality of memory cells in each memory array and a desired one of a plurality of dummy cells in each memory array. The address select circuit is composed of a row address buffer R-ADB, a column address buffer C-ADB, a row address output circuit R-DRV, a column address output circuit C-DRV, row address decoders RDCR1 to RDCR4, a column address decoder CDCR, and a column switch circuit which is provided in correspondence with this decoder CDCR.

Since the arrangement and operation of each of the circuits which constitute the address select circuit are basically the same as those of the circuits shown in FIG. 7, description thereof is omitted.

In this embodiment, the column switch circuit CW and the random input/output lines I/O ar disposed in the region where the column address decoder CDCR is disposed as described above. Accordingly, the column decoder CDCR, the column switch circuit CW and the input/output lines I/O can be disposed in such a manner that they are concentrated with respect to the memory arrays M1 to M4, and it is therefore possible to realize high integration. More specifically, since the column switch and the column decoder are disposed in close proximity with each other, signal lines which are to be disposed therebetween can be formed with the shortest distance. In this embodiment, when the memory arrays M1 and M4 are subjected to a read or write operation, the complementary data lines in the memory array M2 or M3 are used as signal lines. Accordingly, when the memory array M1 or M4 is accessed, the switching circuit S2 or S3 is temporarily turned off at the time of starting the operation of the sense amplifier SA, but it is turned on again when data is to be read out or written.

In this embodiment, the RAM is additionally provided with a serial input/output function. Serial input/output circuits SAM1 and SAM2 are disposed adjacent to the memory arrays M1 and M4, respectively. In this embodiment, although not necessarily limitative, decoders CDCR1 and CDCR2 for setting initial addresses employed for the above-described serial input/output operations are provided with a view to disposing the output lines of the column decoder CDCR at the shortest distance, that is, preventing generation of a coupling noise which would otherwise be generated between the column select lines and the complementary data lines due to extension of the output lines of the column decoder CDCR over the memory arrays M2 and M3.

Since this arrangement needs only one set of column switches CW for random input/output operations and input/output lines I/O corresponding thereto which are provided in correspondence with the column address decoder CDCR, high integration can be realized despite the fact that two sets of sense amplifiers SA are provided as described above.

It should be noted that the serial input/output circuits SAM1 and SAM2 may be disposed at the same position as the sense amplifier SA. However, each of the serial input/output circuits SAM1 and SAM2 is provided therein with unit circuits USR1, USR2, etc. which are disposed in the ratio of one to a plurality of data line pairs. Accordingly, it is preferable to dispose the serial input/output circuits SAM1 and SAM2 at a position which is spaced apart from the sense amplifier SA with a view to balancing the parasitic capacitances connected to the data line pairs and also preventing malfunction of the sense amplifier SA. It is also possible to omit the decoders CDCR1 and CDCR2 for designating the top address for serial input/output operations and utilize the output signal from the column address decoder CDCR for random input/output operations instead.

The above-described embodiment provides the following advantages:

(1) In a shared sense type dynamic RAM wherein a sense amplifier selectively receives and senses storage information from a pair of memory arrays, a serial input/output circuit which is used in common to both the memory arrays is disposed in correspondence with the data lines in one of the memory cells, whereby two sets of memory arrays and shared sense amplifiers can be disposed in bisymmetry with each other with respect to one serial input/output circuit, and it is therefore possible to realize high integration of a RAM having an increased memory capacity.

(2) In the above-described arrangement wherein a serial input/output circuit which is used in common to both the memory arrays is formed in correspondence with the data lines in one of the memory arrays, two sets of shared sense amplifiers and memory arrays are disposed in bisymmetry with each other with respect to the serial input/output circuit, each sense amplifier having column switches for random input/output operations and input/output lines disposed adjacent thereto, and further, the above-described arrangement is disposed bisymmetrically at either side of a column address decoder, whereby it is possible to obtain a RAM having a large memory capacity which is additionally provided with a serial input/output function without much increasing the circuit size.

(3) In the above-described arrangement wherein column switches for random input/output operations and a column decoder which are used in common to both the memory arrays are formed in correspondence with the data lines in one of the memory arrays, two sets of shared sense amplifiers having the above-described arrangement and memory arrays corresponding thereto are disposed in bisymmetry with each other with respect to the column address decoder and random input/output circuit, whereby it is possible to realize high integration of a RAM employing shared sense amplifiers.

Although the invention accomplished by the present inventors has been described specifically by way of embodiments, it should be noted here that the present invention is not necessarily limitative to the described embodiments, and various changes and modifications may, of course, be imparted thereto without departing from the gist of the invention. For example, in the arrangement shown in FIG. 7 the memory mat which is disposed at the right- or left-hand side of the column address decoder CDCR1 may be omitted. In other words, the arrangement may be such that the column address decoder CDCR forms select signals with respect to four memory arrays. The number of bits of information to be input or output may be 1 in addition to 8 or 4 as in the case of the above-described embodiments.

The serial input/output circuit may be arranged such that the pointer is omitted and the output signal from the column address decoder is supplied directly to the shift register. The shift register may be employed as a data transfer register for a serial/parallel converting operation. The random input/output circuit IOBR may be provided with an arithmetic function. More specifically, the random input/output circuit IOBR may be arranged such that an arithmetic control signal set mode is designated in accordance with the combination of, for example, external control signals $\overline{RAS}$, $\overline{CAS}$ and $\overline{WE}$, and an arithmetic mode signal is supplied from the address terminal or the input/output terminal and, in addition, the signal read out from the memory array and input information supplied from an external terminal are subjected to a logical calculation according to the arithmetic mode to thereby form a write signal.

The precharge circuit in the embodiment shown in FIG. 9 may be provided at the input/output terminal side of the sense amplifier. In such a case, the number of MOSFETs constituting the precharge circuit and the number of control signal lines therefor can be halved. Further, the sense amplifier may be formed by utilizing a CMOS latch circuit. More specifically, the arrangement may be such that each unit circuit of the sense amplifier is defined by a CMOS inverter circuit having its input and output terminals cross-coupled to each other, and the power supply voltage and the ground potential of the circuit are supplied to each unit circuit in accordance with the operation timing signal for the sense amplifier.

The present invention may widely be applied to dynamic RAMs employing shared sense amplifiers, in addition to a dual-port RAM which is additionally provided with a serial input/output function such as that described above.

What is claimed is:

1. A dual port semiconductor memory comprising:
    a memory cell array including a plurality of word lines, a plurality of data lines and a plurality of memory cells coupled to intersections of said word lines and data lines such that said memory cells have control terminals thereof coupled to the word lines and data input/output terminals thereof coupled to the data lines;

a random access input/output circuit coupled to said memory cell array to provide random access to said memory cell array in accordance with addresses supplied from an external terminal coupled to said random access input/output circuit;

a first serial access data register coupled to said data lines of said memory cell array;

a second serial access data register coupled to said data lines of said memory cell array;

means coupled to said first and second serial access data registers to permit transfer of data between said data lines and either one of said first and second serial access data registers;

a serial input/output circuit;

means for coupling said first and second serial access registers to said serial input/output circuit; and means for controlling the connection of the first and second serial access data registers to said data lines and to said serial input/output circuit so that said data previously transferred to one of said first and second serial access data registers is transferred to said serial input/output circuit registers is coupled to said data lines to allow information transfer between said data lines and said other of said first and second serial access data registers.

2. A dual port semiconductor memory circuit according to claim 7, wherein said means for controlling the connection of the first and second serial access data registers comprises a first plurality of switching means coupled between the data lines of the memory array and the first and second serial access data registers, a second plurality of switching means coupled between the first and second serial access data registers and the serial input/output circuit and control means for controlling the operation of the first and second pluralities of switching means to control the connection of the first and second serial access data registers to the data lines and to the serial input/output circuit.

3. A semiconductor memory comprising:

a memory cell array including a first word line, a second word line, a first plurality of memory cells having respective select terminals thereof mutually coupled to said first word line, a plurality of data lines to which are respectively coupled to input/output terminals of said plurality of memory cells, and a second plurality of memory cells having respective select terminals thereof mutually coupled to said second word line and having input/output terminals thereof respectively coupled to said plurality of data lines;

first storage means for storing readout information from said plurality of memory cells coupled to said first word line;

second storage means for storing readout information from said plurality of memory cells coupled to said second word line;

means coupled to said first and second storage means to permit transfer of data between said data lines and either one of said first and second storage means;

a serial output circuit;

means for coupling said first and second storage means to said serial output circuit; and means for controlling the connection of the first and second storage means to said data lines and to said serial output circuit so that said data previously transferred to one of said first and second storage means is transferred to said serial output circuit while the other of said first and second storage means is coupled to said data lines to allow information transfer between said data lines and said other of said first and second storage means.

4. A semiconductor memory according to claim 3, wherein said means for controlling the connection of the first and second storage means comprises a first plurality of switching means coupled between the data lines of the memory cell array and the first and second storage means, a second plurality of switching means coupled between the first and second storage means and the serial output circuit, and control means for controlling the operation of the first and second pluralities of switching means to control the connection of the first and second storage means to the data lines and to the serial output circuit.

5. A semiconductor memory according to claim 4, wherein said each memory cell includes a series connection comprising a switching MISFET and a storage capacitor.

6. A semiconductor memory comprising:

a sense amplifier;

a pair of memory arrays disposed at both sides, respectively, of said sense amplifier and connected to said sense amplifier so that said sense amplifier is shared by said memory arrays;

a serial input/output circuit coupled to be used in common by said pair of memory arrays;

storage means coupled between said pair of memory arrays and said serial input/output circuit, said storage means including means for storing readout information from either one of said pair of memory arrays, wherein said storage means and said serial input/output circuit operate to provide a serial output of readout information stored in said storage means; and means coupled to said sense amplifier and said memory arrays to operatively couple only one memory array of said pair of memory arrays to said sense amplifier at a time.

7. A semiconductor memory according to claim 6, wherein said means comprises a first switching means coupled between one of said memory arrays and the sense amplifier and a second switching means coupled between the other memory array and the sense amplifier.

8. A semiconductor memory comprising:

a pair of memory arrays each including a first word line, a second word line, a first plurality of memory cells having respective select terminals thereof mutually coupled to said first word line, a plurality of data lines to which are respectively coupled to input/output terminals of said plurality of memory cells, and a second plurality of memory cells having respective select terminals thereof mutually coupled to said second word line and having input/output terminals thereof respectively coupled to said plurality of data lines;

first storage means for storing readout information from said plurality of memory cells coupled to said first word line;

second storage means for storing readout information from said plurality of memory cells coupled to said second word line;

means coupled to said first and second storage means to permit transfer of data between said data lines and either one of said first and second storage means;

a serial output circuit;

means for coupling said first and second storage means to said serial output circuit;

means for controlling the connection of the first and second storage means to said data lines and to said serial output circuit so that said data previously transferred to one of said first and second storage means is transferred to said serial output circuit while the other of said first and second storage means is coupled to said data lines to allow information transfer between said data lines and said other of said first and second storage means;

a sense amplifier coupled between said pair of memory arrays; and means coupled to said sense amplifier and said memory arrays to operatively couple only one memory array of said pair of memory arrays to said sense amplifier at a time.

9. A dual port semiconductor memory comprising:

a pair of memory cell arrays each including a plurality of word lines, a plurality of data lines and a plurality of memory cells coupled to intersections of said word lines and data lines such that said memory cells have control terminals thereof coupled to the word lines and data input/output terminals thereof coupled to the data lines;

a random access input/output circuit coupled to said memory cell array to provide random access to said memory cell array in accordance with addresses supplied from an external terminal coupled to said random access input/output circuit;

a first serial access data register coupled to said data lines of said memory cell array;

a second serial access data register coupled to data lines of said memory cell array;

means coupled to said first and second serial access data registers to permit transfer of data between said data lines and either one of said first and second serial access data registers;

a serial input/output circuit;

means for coupling said first and second serial access registers to said serial input/output circuit;

means for controlling the connection of the first and second serial access data registers to said data lines and to said serial input/output circuit so that said data previously transferred to one of said first and second serial access data registers is transferred to said serial input/output circuit while the other of said first and second serial access data registers is coupled to said data lines to allow information transfer between said data lines and said other of said first and second serial access data registers;

a sense amplifier coupled between said pair of memory cell arrays; and means coupled to said sense amplifier and said memory arrays to operatively couple only one memory array of said pair of memory arrays to said sense amplifier at a time.

10. A semiconductor memory according to claim 3, wherein each of said first and second storage means is comprised of a plurality of unit data registers respectively coupled to predetermined data line pairs of said plurality of data lines, and wherein said control means includes means for selecting a predetermined one of said unit data registers for transferring data between said selected unit data register and a predetermined data line pair.

11. A semiconductor memory according to claim 1, wherein each of said first and second serial access data registers is comprised of a plurality of unit data registers respectively coupled to predetermined data line pairs of said plurality of data lines, and wherein said control means includes means for selecting a predetermined one of said unit data registers for transferring data between said selected unit data register and a predetermined data line pair.

* * * * *